United States Patent
Yamashiki et al.

(10) Patent No.: US 7,291,444 B2
(45) Date of Patent: Nov. 6, 2007

(54) PHOTOSENSITIVE CERAMIC COMPOSITE AND METHOD FOR MANUFACTURING MULTILAYER SUBSTRATE INCLUDING THE COMPOSITE

(75) Inventors: Tomoya Yamashiki, Otsu (JP); Takenori Ueoka, Otsu (JP); Mitsuyo Shimba, Otsu (JP)

(73) Assignee: Toray Industries, Inc., Tokyo (JP)

( * ) Notice: Subject to any disclaimer, the term of this patent is extended or adjusted under 35 U.S.C. 154(b) by 546 days.

(21) Appl. No.: 10/494,438

(22) PCT Filed: Oct. 28, 2002

(86) PCT No.: PCT/JP02/11149

§ 371 (c)(1),
(2), (4) Date: Apr. 30, 2004

(87) PCT Pub. No.: WO03/038524

PCT Pub. Date: May 8, 2003

(65) Prior Publication Data

US 2004/0249040 A1    Dec. 9, 2004

(30) Foreign Application Priority Data

Nov. 1, 2001 (JP) ............................. 2001-336151
Apr. 24, 2002 (JP) ............................. 2002-121938

(51) Int. Cl.
*G03F 7/004* (2006.01)

(52) U.S. Cl. ............ 430/284.1; 430/198; 430/18; 430/330; 430/311; 430/281.1; 430/285.1; 430/288.1

(58) Field of Classification Search ................ 430/198
See application file for complete search history.

(56) References Cited

FOREIGN PATENT DOCUMENTS

| | | |
|---|---|---|
| JP | 10-265270 | 10/1998 |
| JP | 10-279364 | 10/1998 |
| JP | 10-279364 A | * 10/1998 |
| JP | 10-2656270 A | * 10/1998 |
| JP | 2000-44640 | 2/2000 |
| JP | 2000-44640 A | * 2/2000 |
| JP | 2002-148786 | 5/2002 |

OTHER PUBLICATIONS

Machine translation of JP 2000-044640 published Feb. 15, 2000 from www19.ipdl.ncipi.go.jp and patent Abstracts of Japan.*
Machine translation of JP 10-279364 published Oct. 20, 1998 from www19.ipdl.ncipi.go.jp. and Patent Abstracts of Japan.*
Machine translation of JP 10-265270 published Oct. 6, 1998 from www19.ipdl.ncipi.go.jp. and Patent Abstracts of Japan.*
English Abstract of JP 10-279364, 2007.
English Abstract of JP 10-265270, 2007.
English Abstract of JP 2000-44640, 2007.
English Abstract of JP 2002-148786, 2007.

* cited by examiner

*Primary Examiner*—Cynthia Hamilton
(74) *Attorney, Agent, or Firm*—Morrison & Foerster LLP

(57) ABSTRACT

The present invention relates to a photosensitive ceramic composite and a method for manufacturing a multilayer substrate using the composite. The photosensitive ceramic composite and manufacturing method of the present invention are applicable to circuit members and components for ceramic multilayer substrates for high-frequency wireless communication. The photosensitive ceramic composite contain inorganic particles and a photo sensitive organic components. The inorganic particles have at least surface sections containing an inorganic material having a refractive index less than that of inner sections of the inorganic particles.

21 Claims, No Drawings

PHOTOSENSITIVE CERAMIC COMPOSITE AND METHOD FOR MANUFACTURING MULTILAYER SUBSTRATE INCLUDING THE COMPOSITE

CLAIM FOR PRIORITY

This application claims priority to Japanese Application No. 2001-336151, filed Nov. 1, 2001, and Japanese Application No. 2002-121938, filed Apr. 24, 2002.

TECHNICAL FIELD

The present invention relates to a photosensitive ceramic composite and a method for manufacturing a multilayer substrate using the composite. The ceramic multilayer substrate and manufacturing method of the present invention are applicable to circuit members and components of ceramic multilayer substrates for high-frequency wireless communication.

BACKGROUND ART

Wireless communication technology including cellular phones has been widely used. Known cellular phones use a quasi-microwave band with a range of 800 MHz to 1.5 GHz. However, since the information content has been increased, wireless communication techniques using carrier frequencies in the millimeter wave band, which is higher than the microwave band, have been proposed and are in practical use. Wireless communication circuits for such high frequencies are expected to be used for mobile communications and network devices and increased in importance because such circuits are used Bluetooth and ITS (Intelligent Transport System).

In order to achieve the high-frequency circuits, materials for substrates included in the circuits must have superior high-frequency propagation characteristics at desired frequencies, that is, 1 to 100 GHz. In particular, ceramic substrates have attracted much attention because the following requirements are necessary to obtain such high-frequency propagation characteristics: low dielectric loss, high processing accuracy, and high dimensional stability.

However, known materials for ceramic substrates have high dimensional stability but low micro-processing accuracy; hence, satisfactory characteristics cannot be obtained at high frequencies. In order to improve the microprocessing accuracy, the following technique is disclosed in Japanese Unexamined Patent Application Publication No. 6-202323: a technique for forming via-holes in a green sheet containing a photosensitive ceramic composite by a photolithographic process. However, in the technique, there is a problem in that via-holes having a diameter of 100 µm or less cannot be uniformly formed in the sheet having a high aspect ratio, for example, a thickness of more than 50 µm in an accurate manner because the photosensitive ceramic composite has low sensitivity and resolution.

Since known photo-cured photosensitive green sheets have low elongation and tensile strength, there is a problem in that the sheets are damaged in sheet-handling steps such as a step of forming via-holes in the sheets peeled off from a film, a step of filling the via-holes with conductive paste, a step of forming a conductive pattern on the sheets, and a step of stacking the resulting sheets.

A process for preparing multilayer substrates using a ceramic material includes a step of forming via-holes in ceramic green sheets; a step of filling the via-holes with conductive paste or conductive metal powder; a step of forming a conductive pattern, for forming electrodes and/or circuits, on the resulting sheets; a step of stacking the sheets having the via-holes and conductive pattern to press the resulting sheets to form a green compact; a step of cutting the green compact into pieces, having a desired size, for preparing the substrate; and a step of firing the obtained pieces. In the firing step, the pieces are shrunk by 10% to 20%. Since the shrinkage is not necessarily uniform, the dimensional accuracy is lowered and the yield is therefore reduced.

On the other hand, substrates for circuits principally used for high-frequency wireless communication are used to manufacture mobile apparatuses as described above. Therefore, in order to increase the wiring density, the accuracy of processing via-holes must be enhanced and the diameter of the via-holes must be reduced. In addition, the shape and volume of modules including components are limited when the modules are placed in housings of the mobile apparatuses. Furthermore, since the directivity and sensitivity of internal antennas are greatly varied depending on the shape of a dielectric material, the degree of freedom in trimming must be high. However, since ceramic materials are hard and brittle, the trimming thereof seems to be difficult and has been hardly tried due to the low machinability.

The technique for processing the via-holes in the ceramic substrate by a photolithographic process has been disclosed as described above. However, in order to reduce the size of the mobile apparatuses, demands for microprocessing are increased; hence outer regions of packages must be machined.

The following apparatuses usually include glass ceramic multilayer substrates in principle for the above reasons: compact wireless terminals such as cellular phones and PDA (Personal Digital Assistance), image information systems such as digital video cameras and navigation systems for automobiles, and personal computers having a wireless communication function. In those apparatuses, there are many requirements for the package shape in view of the portability, the reduction in size, and the resistance to physical impact. This is because the following problems must be prevented since the portability and the reduction in size are demanded: a decrease in packaging volume available in the apparatuses, irregularities inside housing members, and interference between other components and modules.

A current technique for trimming sheets usually uses an NC punching machine or a die and has the problems below.

(1) A punching process using such an NC punching machine causes an increase in time to form continuous cutting lines.

(2) A punching process using such a die gives high productivity but causes an increase in cost because of the preparation of dies that can cope with arbitral shapes. The process also causes an increase in the number of manufacturing steps because a new die must be prepared when the substrate design is slightly modified.

(3) As is common with the NC punching machine and the die, the diameter of through-holes and via-holes is 0.1 mm or more because the minimum diameter of pins is about 0.1 mm. Therefore, the reproducibility of the shape is unsatisfactory in some cases when the external shape is machined.

(4) As is common with the NC punching machine and the die, green sheets formed on a sheet and then trimmed are isolated from each other when the external shapes have independent patterns. A step of stacking the resulting sheets is extremely complicated because the sheets must be aligned with each other, and the misalignment between the independent patterns is large.

As described above, the known machining processes are unsatisfactory for the sheet trimming. Therefore, the following substrate is proposed: a multilayer glass-ceramic substrate having an arbitrary external shape that is extremely fine and can be formed by a simple process, for example, a photolithographic process used for microprocessing via-holes or the like on a trial basis.

When sheets are trimmed by such a photolithographic process, the surface area of developed regions of the sheets is greatly different from that of other regions in contact with a developing solution in a developing step as compared with the processing of the via-holes. Therefore, the swelling rate of the sheets placed in the developing solution must be maintained constant and low. When the trimmed sheets are stacked and then fired, warpage and distortion can occur and cracks may be formed in some cases because stress concentration occurs in the sheets.

Since the trimmed sheets have independent patterns formed by trimming, the sheets must be processed in steps between the developing step and the stacking step in such a manner that the flexibility of the sheets is maintained.

In order to obtain satisfactory characteristics at high frequencies by increasing the degree of microprocessing source materials of ceramic substrates having high dimensional stability and a low dielectric loss tangent, fine via-holes having a high aspect ratio must be formed by a photolithographic process.

Furthermore, the sheets processed or not must be in a suitable condition fit for a step of forming a multilayer substrate in addition to the formation of such via-holes. Therefore, the photo-cured sheets must have an elongation, tensile modulus, and strength that are substantially equal to those of ordinary non-photosensitive green sheets.

A microprocessing technique using the photolithographic process is useful not only for processing the via-holes in the multilayer substrate but also for reducing the size of modules and for enhancing the performance. Therefore, a practical technique for processing the multilayer substrate by a photolithographic process is critical.

It is an object of the present invention to provide a ceramic material that can be microprocessed by the photolithographic process and are fit for a step of stacking the sheets to prepare the multilayer substrate as described above and also provide a new method for processing the multilayer substrate containing the material and a circuit substrate obtained by the method.

DISCLOSURE OF INVENTION

The present invention basically has the configuration below.

A photosensitive ceramic composite contains inorganic particles and a photosensitive organic component, wherein the inorganic particles have at least surface sections containing an inorganic material having a refractive index less than that of inner sections of the inorganic particles.

The photosensitive ceramic composite has a dimensional change of 1 to 1.5 in a developing step and contains the inorganic particles (component B) and the photosensitive organic component (component A) containing a (meth) acrylate compound (sub-component A1) and a urethane compound (sub-component A2) having an ethylenic unsaturated group. The (meth)acrylate compound is represented by the following formula:

$$CH_2=CR^1COO-(R^2)_n-R^3-R^O \quad (1)$$

wherein $R^O$ represents a $CH_2=CR^1COO-(R^2)_n-$ group, a hydrogen atom, or a halogen atom; $R^1$ represents a hydrogen atom or a methyl group; $R^2$ represents an alkylene oxide group or an alkylene oxide oligomer group; $R^3$ represents a cyclic or acyclic group selected from the group consisting of an alkylene group, an aryl group, an aryl ether group, an arylene group, an arylene ether group, an aralkyl group, and an aralkylene group having 1 to 15 carbon atoms or represents such a cyclic or acyclic group having a substituent such as an alkyl group having 1 to 9 carbon atoms, a halogen atom, a hydroxy group, or an aryl group; and n represents an integer of 1 to 5.

A method for manufacturing a multilayer substrate using the photosensitive ceramic composite containing the inorganic particles and photosensitive organic component includes the following steps:

(1) a step of forming the photosensitive ceramic composite into photosensitive green sheets;

(2) a step of trimming the resulting photosensitive green sheets by a photolithographic process;

(3) a step of stacking the resulting photosensitive green sheets; and (4) a step of firing the resulting photosensitive green sheets.

Alternatively, the present invention provides a multilayer substrate manufactured by the above method.

BEST MODE FOR CARRYING OUT THE INVENTION

A photosensitive ceramic composite of the present invention necessarily contains inorganic particles and a photosensitive organic component. The inorganic particles must have surface sections containing an inorganic material with a refractive index less than that of inner sections of the inorganic particles. In the inorganic particles, each inner section is placed at a position deeper than that of each different surface material and occupies a major part of each inorganic particle, that is, the inner section almost entirely occupies the inorganic particle other than the different surface material. The percentage of the different surface material in the inorganic particle is not particularly limited and is preferably within a range of $1 \times 10^{-4}$ to $2 \times 10$ percent by weight (more preferably $1 \times 10^{-3}$ to $1 \times 10$ and further more preferably $2.5 \times 10^{-2}$ to 5 percent by weight). Therefore, the percentage of the inner section is substantially the remainder. When the percentage of the different surface material is outside the above range, the section containing the different surface material described below cannot have a suitable thickness. Furthermore, when the percentage of the inner section is extremely small, the optimum performance of a ceramic material obtained finally cannot be achieved in some cases. Therefore, the percentage outside the above range is not preferable. Characteristics (refractive index and the like) of the inner section can be assumed to be substantially the same as those of the entire inorganic particle including the different surface material in some cases. In order to precisely determine the characteristics of the inner section, portions of the inorganic particle may be measured for each characteristic, whereby an average measurement is obtained. The particle portions are arranged in the radius direction of the inorganic particle and are 0.2×r apart from the surface (within a range of 0.2×r to r in the depth direction), wherein r represents the radius (the distance between the surface and the center when the inorganic particle is not spherical) of the inorganic particle. The difference in physical characteristic and/or the difference in chemical characteristic is not particularly limited if characteristics of the photosensitive ceramic composite can be improved by modifying surface properties of the inorganic particle. The refractive indexes are preferably different from each other and small in particular as described below.

The formula $5 \leq t \leq 200$ (nm) is preferably satisfied, wherein t represents the thickness of the section containing the different surface material. When the thickness is within the above range, the adhesion of the particle surface is satisfactory and reflection and scattering can be prevented from occurring at the interface between the inorganic particle and the organic component. It is preferable that $10 \leq t$ (nm), because the advantage of preventing the reflection and scattering is great. It is preferable that $t \leq 150$ (nm), because the advantage of preventing the reflection and scattering is greater and the inorganic particles can be prevented from being aggregated; hence, the inorganic particles can be preferably used. When $40 \leq t$ (nm), the inorganic particles can be more preferably used. This is because the reflection and scattering of UV rays used for an ordinary photolithographic process can be effectively prevented. When $t \leq 100$ (nm), the inorganic particles can be more preferably used. When the thickness is within the above range, the inorganic particles can be prevented from being aggregated and the thickness is uniform; hence, the advantage of preventing the reflection and scattering is great. The section containing the different surface material preferably has a uniform thickness and is preferably flat as described above; however, an aspect of the section is not particularly limited to the above and the section may be irregular or granular in some cases. A method for joining the inorganic particles to the section containing the different surface material is not particularly limited as long as the section is not substantially removed from the inorganic particles during the handling (compounding or the like) of the photosensitive ceramic composite, which is paste. Examples of the method include a method of using a physical binding effect obtained by plasma-treating the surface of the inorganic particles to roughen the surface and then providing the different surface material on the resulting surface; a method of allowing a solution, for forming the different surface material, to contain a coupling agent (for example, silane coupling agent SILA-ACE manufactured by Chisso Corporation, vinyltrimethoxysilane, N-(2-aminoethyl)-3-aminopropylmethyl dimethoxysilane, 3-glycidoxypropylmethyldimethoxysilane, 3-methacryloxypropyltrimethoxysilane, and N,N'-bis[3-(trimethoxysilyl)propyl]-ethylenediamine) for enhancing the bonding force by chemically modifying the interface; and a method of enhancing the adhesion using an adhesive (for example, Mechanofusion AMS-Lab, a surface modifier manufactured by Hosokawamicron Corporation) based on a mechanochemical reaction caused by the collision of particles.

The ratio (S2/S1) of the area (S2) of the section containing the different surface material to the surface area (S1) of each inorganic particle is most preferably 1. The section need not entirely cover the inorganic particle. In that case, the ratio S2/S1 is preferably 0.4 or more (more preferably 0.6 or more and further more preferably 0.8 or more).

The following formulas are preferably satisfied:

$0.05 \leq R1-R2$ $0.15 \leq R2-R3$ wherein R1 represents the refractive index of the inner section of the inorganic particle, R2 represents the refractive index of the material having low refractive index according to the present invention, and R3 represents the refractive index of the photosensitive organic component. Since inorganic materials have a density greater than that of organic materials in general, the refractive index of the inorganic particle is greater than that of the photosensitive organic component. Therefore, a difference in refractive index between the different surface material and the organic component can be reduced by selecting a condition that the refractive index of the different surface material is less than that of the inorganic particle, whereby the advantage of preventing the light reflection and scattering is enhanced. The upper limit of the refractive index difference (R1−R2) is not particularly limited and is preferably 1 or less (more preferably 0.6 or less and further more preferably 0.4 or less). This is because the refractive index of the inorganic particle does not exceed 2.5 in usual, the refractive index of air is 1.0, and the refractive index of the different surface material is equal to an intermediate therebetween. The refractive index difference (R2−R3) is preferably −0.15 or more as described above because scattering occurs due to a difference in refractive index when the refractive index R2 of the material having low refractive index is extremely less than the refractive index R3 of the photosensitive organic component. The upper limit of the refractive index difference (R2−R3) is preferably 0.8 or less (more preferably 0.5 or less and further more preferably 0.3 or less). This is because the refractive index of the organic component hardly exceeds 2.0 and an extremely large difference in refractive index causes scattering.

When the refractive index of the material having low refractive index according to the present invention varies in the thickness direction, the refractive index of a surface portion is employed.

When the refractive index of the material having low refractive index cannot be measured, the photosensitive ceramic composite having the above configuration according to the present invention can be identified by the method described below.

The photosensitive ceramic composite can be identified when the formula $1.1 \leq ST1/ST2$ is satisfied, wherein ST1 represents the rectilinear beam transmittance of the photosensitive ceramic composite and ST2 represents the rectilinear beam transmittance of the photosensitive ceramic composite that does not have the section containing the material having low refractive index.

The photosensitive ceramic composition having no section containing the material with low refractive index may have chemical composition different from that of the photosensitive ceramic composite except for the material having low refractive index as long as the photosensitive ceramic composition has the same optical factors, which affect the rectilinear beam transmittance, as those of the photosensitive ceramic composite. The optical factors are as follows: the refractive index of the inorganic particles, the refractive index of the photosensitive organic component, and the volume ratio of the inorganic particles to the photosensitive organic component, and the average particle size and sphericity of the inorganic particles.

The rectilinear beam transmittance is defined as the percentage of the amount of light propagated in parallel without changing the path in the amount of light applied to a sample. Light beams used for the measurement preferably have the same wavelength as that of light beams used for exposure and include a g-beam having a wavelength of 436 nm and an i-beam having a wavelength of 365 nm. Examples of a light source of such beams include a high-pressure mercury lamp and a light source (such as a halogen lamp for emitting visible rays) for emitting beams having the same wavelengths as those of the g- and i-beams. In an embodiment of the present invention, the value of the rectilinear beam transmittance ratio (ST1/ST2) is preferably 1.2 or more and more preferably 1.5 or more.

The material having low refractive index according to the present invention preferably contains at least one selected from the group consisting of ZnS, $CeF_2$, $MgF_2$, and $SiO_2$. This is because those compounds have a relatively small absorption coefficient and are therefore extremely transparent. The absorption coefficient varies depending on a method for forming a layer. According to data disclosed in S. Aizenburg and R. Chabot, J. Appl. Phys. 42 (1971) 2953; Pei-Fu Gu, Yen Ming Chan, Xue Qun Hu, and Jin-Fa Tang, Appl. Opt. 28 (1989) 3318; and the like, the absorption coefficient of $SiO_2$ is about $2 \times 10^{-5}$. The data was determined using a light beam having a wavelength of 550 nm. According to the above documents, the absorption coefficient can be determined with respect to a desired wavelength, that is, the wavelength of a light beam used for measuring the beam transmittance, by calculation.

The average particle size of the inorganic particles is preferably within a range of 0.1 to 10 μm. The particle size is determined using a laser-scattering particle size distribution meter. The average particle size is equal to a 50%-distribution particle size. The 50%-distribution particle size is defined as the particle size of which the distribution is 50%, and the average particle size hereinafter means the 50%-distribution particle size unless otherwise specified. When the average particle size is less than 0.1 μm, the inorganic particles cannot be mixed with the photosensitive organic component well and cannot therefore be dispersed therein and the inorganic particles have a surface area insufficient to provide the section containing the different surface material. In contrast, when the average particle size is more than 10 μm, principle light in the ultraviolet to visible range is scattered. The average particle size is more preferably 0.3 μm or more. This is because the inorganic particles can be readily mixed with the photosensitive organic component and dispersed therein by a physical method using a three-roll mill. Furthermore, the average particle size is preferably 5 μm or less. When the average particle size is 5 μm or less, the particles hardly scatter light and a mixture of the photosensitive organic component and the particles has a constant viscosity, whereby a difference in the strength of each sheet prepared using the mixture can be reduced.

Furthermore, the average particle size is preferably 0.5 μm or more. When the average particle size is 0.5 μm or more, the particles dispersed in the photosensitive organic component efficiently absorb light for exposure and a developing solution uniformly penetrate the particles when the particles are immersed in the solution in a developing step, whereby the time of an exposing step and the time of the developing step can be reduced.

Furthermore, the average particle size is preferably 3.5 μm or less when a high-resolution pattern is necessary, because a cross-sectional shape formed by exposure and development is flat.

The formula N1−N2<0.15 is preferably satisfied, wherein N1 represents the refractive index of a component having a maximal refractive index and N2 represents the refractive index of a component having a minimal refractive index. The maximal refractive index component is defined as a component having the largest refractive index among components which are contained in the composite and of which the refractive index can be individually determined. The minimal refractive index component is defined as a component having the smallest refractive index among components which are contained in the composite and of which the refractive index can be individually determined. When the above formula is satisfied, light scattering can be readily reduced.

The inorganic particles preferably contain at least one selected from the group consisting of alumina, zirconia, magnesia, beryllia, mullite, spinel, forsterite, anorthite, celsian, and aluminum nitride. Those compounds are contained in glass ceramics for the purpose of enhancing the mechanical strength, controlling the thermal properties such as the thermal expansion coefficient, or controlling the dielectric constant or the dielectric loss tangent. The compounds have a small thermal expansion coefficient, which is within an order of magnitude of $10^{-6}$ to $10^{-7}$ (/° C.) when measured at 25° C. to 300° C. Therefore, the heat distortion of the compounds is slight. Thus, the section containing the different surface material is hardly removed from each inorganic particle even if the temperature varies depending on manufacturing steps after the section is formed on the inorganic particle.

The inorganic particles are sintered in a firing step. In order to prepare a substrate according to the present invention, the firing temperature is preferably 1000° C. or less and more preferably 600° C. to 950° C., that is, the inorganic particles are preferably fired at low temperature. Since basic properties of the substrate depend on properties of the inorganic particles, the inorganic particles must be carefully selected. The basic properties include electrical characteristics, the strength, and the thermal expansion coefficient. The following material is selected: a ceramic material or a glass ceramic material that can be fired at low temperature. In the glass ceramic material, a glass component is sintered and a ceramic component functions as a filler. Therefore, the substrate prepared using the inorganic particles has a desired strength and dielectric characteristics.

Most of known glass ceramic materials have high dielectric loss and high-frequency characteristics thereof are therefore insufficient. The inorganic particles of the present invention can be preferably fired at 600° C. to 950° C., whereby a substrate including wires containing Cu, Ag, or Au is prepared. The substrate has a thermal expansion coefficient close to that of a printed circuit board or a chip component containing GaAs or the like and also has low dielectric constant and dielectric loss at high frequencies.

Components of the inorganic particles are selected depending on the properties described above and examples of the components include the four examples below.

A first example is a system containing an aluminosilicate compound represented by the formula $RxO—Al_2O_3—SiO_2$, wherein R represents an alkaline metal element or an alkaline earth metal element and x is equal to 2 or 1 when R represents such an alkaline metal element or alkaline earth metal element, respectively. Examples of the aluminosilicate compound, which is not particularly limited, include anorthite ($CaO—Al_2O_3-2SiO_2$) and celsian ($BaO—Al_2O_3—SiO_2$), which are inorganic compounds used for manufacturing low-temperature sintered ceramics.

A second example is a mixture containing 50% to 90% of glass particles and 10% to 50% of quartz particles and/or amorphous silica particles on a weight basis. The glass particles contain borosilicate glass. It is preferable that the quartz particles and/or the amorphous silica power be not melted together with borosilicate glass or cordierite. The quartz particles and/or the amorphous silica particles preferably contain spherical silica particles because the filling factor of slurry is high. Quartz and amorphous silica individually have an extremely small dielectric loss tangent within an order of magnitude of $10^{-5}$ and therefore have a small dielectric loss. Therefore, the quartz particles and/or the amorphous silica power contained in the inorganic particles reduce the dielectric loss of the particles.

A third example is a mixture containing 30% to 60% of borosilicate glass particles, 20% to 60% of quartz particles and/or amorphous silica particles, and 20% to 60% of ceramic particles containing at least one selected from the group consisting of cordierite, spinel, forsterite, anorthite, and celsian on a weight basis.

A fourth example is a mixture containing 30% to 60% of glass particles and 40% to 70% of ceramic particles. The glass particles contain 85% or more of oxides and have a $SiO_2$ content of 30% to 70%, an $Al_2O_3$ content of 5% to 40%, a CaO content of 3% to 25%, and a $B_2O_3$ content of 3% to 50% on a weight basis. The ceramic particles contain at least one selected from the group consisting of alumina, zirconia, magnesia, beryllia, mullite, spinel, forsterite, anorthite, celsian, and aluminum nitride. Those percentages are expressed on a weight basis.

The inorganic particles can contain a filler, which is usually the ceramic particles as described above. The filler is useful in enhancing the mechanical strength of the substrate and useful in adjusting the thermal expansion coefficient thereof. In particular, alumina, zirconia, mullite, and anorthite are satisfactory in such functions. When the inorganic particles are a mixture of those ceramic particles, the inorganic particles can be fired at 800° C. to 900° C., whereby the substrate is allowed to have a desired strength, dielectric constant, thermal expansion coefficient, sintered density, volume resistivity, and shrinkage.

The total content of $SiO_2$, $Al_2O_3$, CaO, and $B_2O_3$ in the glass particles is preferably 85% by weight or more. The content of the remainder is 15% by weight or less, the remainder being $Na_2O$, $K_2O$, BaO, PbO, $Fe_2O_3$, Mn oxides, Cr oxides, NiO, and/or Co oxides. The ceramic particles, mixed with the glass particles having a content of 30% to 60% by weight, having a content of 40% to 70% by weight function as the filler. The content of $SiO_2$ in the glass particles is preferably 30% to 70% by weight. When the $SiO_2$ content is less than 30% by weight, the strength and stability of a glass layer are too low and the dielectric constant and thermal expansion coefficient of the substrate are too high; hence, values of those characteristics are apt to be outside desired ranges. When the $SiO_2$ content is more than 70% by weight, the substrate obtained by firing has an extremely large thermal expansion coefficient and the inorganic particles cannot be fired at 1000° C. or less. The $Al_2O_3$ content is preferably 5% to 40% by weight. When the $Al_2O_3$ content is less than 5% by weight, the strength of the glass layer is low and the inorganic particles cannot be fired at 1000° C. or less. When the $Al_2O_3$ content is more than 40% by weight, the temperature of allowing the glass particles to be fritted is extremely high. The CaO content is preferably 3% to 25% by weight. When the CaO content is less than 3% by weight, the substrate do not have a desired thermal expansion coefficient and the inorganic particles cannot be fired at 1000° C. or less. When the CaO content is more than 25% by weight, the dielectric constant and thermal expansion coefficient of the substrate are extremely high. Since $B_2O_3$ allows glass frit to be melted at about 1300° C. to 1450° C., the $B_2O_3$ content is preferably adjusted such that the inorganic particles can be fired at 800° C. to 900° C. even if the $Al_2O_3$ content is high, whereby electrical, mechanical, and thermal characteristics of the substrate are not deteriorated. Such characteristics include the dielectric constant, the strength, the thermal expansion coefficient, and the sintering temperature. Thus, the $B_2O_3$ content is preferably 3% to 50% by weight.

When the inorganic particles are a mixture of a plurality of types of particles, the section containing the different surface material according to the present invention need not be placed on the surface of each particle, contained in the mixture, having a refractive index less than that of the organic component in some cases. The section containing the different surface material according to the present invention is preferably placed on the surface of each inorganic particle when the inorganic particles has a refractive index of 1.6 or more (more preferably 1.65 or more and further more preferably 1.7 or more) and the content of the high-refractive index material in the inorganic particles is 5% or more (more preferably 10% or more and further more preferably 20% or more) on a weight basis, whereas the refractive index and the content are not particularly limited.

In order to use the inorganic particles to prepare green sheets, the content of the inorganic particles in the photosensitive ceramic composite is preferably 60% to 95% (more preferably 60% to 90% and further more preferably 65% to 85%) on a weight basis when the photosensitive ceramic composite does not contain an organic solvent. When the inorganic particle content is less than the lower limit of the above range, spaces between the inorganic particles are filled with the organic component, whereby ventilation is impaired, the organic component cannot be readily removed in the sintering step, and the dimensional stability of the green sheets is impaired because the volume of the green sheets varies depending on the amount of the organic component removed in the sintering step. In contrast, when the inorganic particle content is more than the upper limit, the flexibility of the green sheets is impaired.

In the present invention, the photosensitive organic component, which is essential for the photosensitive ceramic composite, preferably contains an acrylic copolymer with side chains having a carboxyl group, a photoreactive compound, and a photo-polymerization initiator. The photosensitive organic component may further contain an additive such as a binder polymer, an enhancer, an ultraviolet absorbent, a dispersing agent, a surfactant, an organic dye, a plasticizer, a thickening agent, an oxidation inhibitor, or an antigelling agent according to needs.

The inorganic particles and the photosensitive organic component are essential for the photosensitive ceramic composite of the present invention. The photosensitive organic component preferably contains a (meth)acrylate compound (sub-component A1) and a urethane compound (sub-component A2) having an ethylenic unsaturated group. The term "(meth)acrylate" means acrylate and/or methacrylate, and the same applies to the description below, for example, the term "(meth)acryloyl" means acryloyl and/or methacryloyl.

In the present invention, the photosensitive organic component means an integrated whole that includes organic compounds in the photosensitive ceramic composite, that is, the photosensitive organic component means the remainder of the photosensitive ceramic composite apart from inorganic compounds. The photosensitive ceramic composite of the present invention is in a paste state when used in an applying step or a stacking step and is preferably dispersed in a solvent. In the below description about parameters (for example, the content of each of sub-components A1, A2, and B) associated with the composition of the photosensitive ceramic composite, the amount of the solvent is omitted.

In the present invention, the (meth)acrylate compound (sub-component A1) contained in the photosensitive organic component allows a reaction initiated by light to occur, that is, the (meth)acrylate compound allows a crosslinking reaction or a polymerization reaction to occur, and therefore plays an important role in forming a pattern. Thus, the (meth)acrylate compound must have one or more (meth) acrylate groups functioning as photopolymerizable unsaturated groups.

In the present invention, R1 represents hydrogen or a methyl group and preferably hydrogen.

At least one group represented by R2 preferably has an ethylene oxide group because of the compatibility. Those may be used alone or in combination. The refractive index of the photosensitive organic component (component A) can be readily controlled depending on that of sub-component A1 functioning as a photosensitive monomer. The refractive index of sub-component A1 is preferably 1.5 to 1.7. The content of sub-component A1 in the photosensitive organic component is preferably 10% to 80% (more preferably 10% to 60% and further more preferably 15% to 40%) on a weight basis.

In formula (1), an organic group represented by R3 is preferably an aromatic group such as phenyl group, a phenol group, a biphenyl group, a para-cumylphenol group, a nonylphenol group, a bisphenol A group, or a bisphenol F group because the refractive index is high.

Preferable examples of the compound represented by formula (1) include bifunctional (meth)acrylates such as bisphenol A di(meth)acrylate, di(meth)acrylate of a bisphenol A-ethylene oxide adduct, di(meth)acrylate of a bisphenol A-propylene oxide adduct, bisphenol F di(meth)acrylate, di(meth)acrylate of a bisphenol F-ethylene oxide adduct, and di(meth)acrylate of a bisphenol F-propylene oxide adduct; and monofunctional (meth)acrylates such as phenoxyethyl (meth)acrylate, cyclohexyl (meth)acrylate, benzyl (meth)acrylate, phenyl (meth)acrylate, phenoxydiethylene glycol (meth)acrylate, phenoxypolyethylene glycol (meth)acrylate, phenol (meth)acrylate modified with ethylene oxide, para-cumylphenol (meth)acrylate modified with ethylene oxide, nonylphenol (meth)acrylate modified with ethylene oxide, and nonylphenol (meth)acrylate modified with propylene oxide, because the refractive index is high. Para-cumylphenol (meth)acrylate modified with ethylene oxide is particularly preferable.

In the present invention, R0 represents a group represented by the formula CH2=CR1COO—(R2)n-, a hydrogen atom, or a halogen atom and the hydrogen atom is preferable. When R0 represents the group (when formula (1) has two pairs of R1 or R2), triples of R1, R2, and n in formula (1) may be different from each other or the same as each other, respectively, for at least one pair.

Sub-component A1, represented by formula (1), contained in the composite of the present invention may be a single compound or a mixture consisting of two or more different compounds.

Sub-component A1 can be prepared by the method described below; however, the present invention is not limited the method. Sub-component A1 is prepared by esterifying monohydroxy or dihydroxy alcohol with (meth) acrylic acid according to an ordinary procedure to produce mono(meth)acrylate or di(meth)acrylate, wherein the alcohol has an alkylene oxide unit, formed by an addition reaction, represented by the formula HO—(R2)n-R3 or (HO—(R2)n)2R3 and the (meth)acrylic acid is represented by the formula CH2=CR1COOH. In the esterification, the (meth)acrylic acid may be converted into a highly reactive compound, such as acid halide, which is then subjected to the reaction, and a byproduct-removing agent (such as a dehydrating agent or a hydrogen halide-removing agent) and/or a catalyst may be used.

In the present invention, the urethane compound (sub-component A2) having an ethylenic unsaturated group is not particularly limited but is defined as a compound having a urethane bond (—NHCOO—). Examples of an organic group in the urethane compound include a vinyl group, an allyl group, an acryloyl group, a mathacryloyl group, an alkylene group, an alkylene oxide group, an alkyl group, an aryl group, an arylene group, an aralkyl group, an aralkylene group, a hydroxyalkyl group, and a hydroxyalkylene group, other than the urethane bond. Among those groups, the alkylene oxide group is preferable in view of the compatibility. The urethane compound may have a linear, branched, or cyclic molecular structure, which may have a linear, branched, and/or cyclic portion. The molecular structure is not particularly limited and is preferably linear. The urethane compound preferably has a molecular weight of 800 to 100000 (more preferably 10000 to 50000 and further more preferably 15000 to 45000). When the molecular weight is less than the lower limit of the above range, the urethane compound is excessively rigid, which is not preferable. When the molecular weight is more than the upper limit of the range, the urethane compound has excessively high viscosity, which is not preferable. The amount of the urethane bond in the urethane compound is preferably 0.000016 to 0.0125 mol/g, more preferably 0.00002 to 0.001 mol/g, and further 0.000022 to 0.0007 mol/g. The urethane bond amount is less than the lower limit of the above range, the urethane compound has low flexibility, which is not preferable. When the amount is more than the upper limit of the range, the urethane compound has excessively high elastic modulus, which is not preferable.

In the present invention, the ethylenic unsaturated group of the urethane compound (sub-component A2) preferably has low steric hindrance and a high degree of freedom in molecular motion in view of the crosslinking reaction, that is, it is not preferable that the ethylenic unsaturated group have a large number of large substituents. Therefore, the ethylenic unsaturated group preferably has a single substituent primarily and preferably has two substituents secondarily. The crosslinking reaction is promoted depending on chemical properties of such a substituent or substituents in some cases. Examples of the ethylenic unsaturated group include a vinyl group, an allyl group, an acryloyl group, and a mathacryloyl group. In particular, the acryloyl group and the mathacryloyl group are preferable; however, the ethylenic unsaturated group is not limited to those groups.

In order to allow a polymer to have such side chains, groups having active hydrogen in the polymer are allowed to react with acryloyl chloride, methacryloyl chloride, allyl chloride, or an ethylenic unsaturated compound having a glycidyl group or an isocyanate group. Examples of the ethylenic unsaturated compound having the glycidyl group include glycidyl acrylate, glycidyl methacrylate, allyl glycidyl ether, glycidyl crotonate, and glycidyl isocrotonate. Examples of the ethylenic unsaturated compound having the isocyanate group include (meth)acryloyl isocyanate and (meth)acryloyl ethylisocyanate. One mole of the groups having active hydrogen in the polymer are preferably allowed to react with 0.05 to 0.95 mole of acryloyl chloride, methacryloyl chloride, allyl chloride, or the ethylenic unsaturated compound having the glycidyl group or the isocyanate group. When the groups having active hydrogen are mercaptan groups, amino groups, or hydroxy groups, all of the groups having active hydrogen may be allowed to react with those compounds for forming the side chains. However, when the groups having active hydrogen are carboxyl groups, the groups having active hydrogen are preferably allowed to react with those compounds such that the polymer has a desired acid value.

In the urethane compound of the present invention, the number of the ethylenic unsaturated group is preferably one to six per molecule, more preferably one to four, and furthermore preferably two to three. Alternatively, the amount of the ethylenic unsaturated group in the urethane compound is preferably 0.000016 to 0.0075 mol/g, more preferably 0.000016 to 0.005 mol/g, and further more preferably 0.000033 to 0.0038 mol/g. When the number or amount of the ethylenic unsaturated group is less than the lower limit of the number or amount range, respectively, the polymer cannot be sufficiently cured, which is not preferable. When the number or amount of the ethylenic unsaturated group is more than the upper limit of the number or amount range, respectively, the polymer seriously shrinks when cured, which is not preferable.

When the urethane compound is allowed to function as a photoreactive component, physical properties of the sheets treated in a photo-curing step can be maintained such that the properties are fit for subsequent steps. Furthermore, stress applied to the sheets can be reduced in the firing step, whereby defects can be prevented from occurring in the firing step.

The urethane compound having the ethylenic unsaturated group is preferably a compound, represented by formula (2), having an ethylene oxide group:

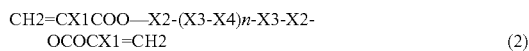

$$CH_2=CX_1COO—X_2-(X_3-X_4)_n-X_3-X_2-OCOCX_1=CH_2 \quad (2)$$

wherein $X_1$ represents hydrogen, a hydroxy group, or a methyl group; $X_2$ and $X_4$ each represent an alkylene oxide group or an alkylene oxide oligomer group; at least one of the group represented by $X_2$ and the group represented by $X_4$ has an ethylene oxide group; $X_3$ represents an aliphatic diisocyanate residue or a cycloaliphatic diisocyanate residue having a urethane bond; and n represents an integer of 1 to 10.

In order to enhance the compatibility, at least one of the alkylene oxide group and the oligomer group represented by $X_2$ or $X_4$ in formula (2) preferably has the ethylene oxide group. In particular, the group represented by $X_4$ preferably has an oligomer segment having an ethylene oxide unit and a propylene oxide unit. In the present invention, sub-component A1 functioning as a photosensitive monomer is preferably monofunctional or bifunctional (meth)acrylate having an aromatic ring. Sub-component A1 is less compatible with a polymer (sub-component A3) with side chains having a carboxyl group because sub-components A1 and A3 have different polarities. However, when the urethane compound with the ethylenic unsaturated group has the ethylene oxide group with high polarity, the urethane compound has a portion with a polarity close to that of the polymer (sub-component A3) and another portion with a polarity close to that of the photosensitive monomer; hence, the urethane compound is compatible with both the polymer (sub-component A3) and sub-component A1, which is the photosensitive monomer. The content of the ethylene oxide unit in the oligomer is preferably within a range of 8% to 70% by weight. When the content of the ethylene oxide unit is more than 70% by weight, the photo-cured oligomer has high elastic modulus, which causes an increase in stress applied to the substrate to cause an increase in defects such as breakages of the substrate. Therefore, the content more than 70% is not preferable. When the content is less than 8%, the photosensitive organic component is less compatible with other components and the haze is therefore high, whereby a pattern cannot be precisely formed. Therefore, the content less than 8% is not preferable.

The haze of the photosensitive organic component can be determined according to the following procedure: the photosensitive organic component is applied to a glass substrate, which is then measured with a haze meter. A layer, placed on the substrate, containing the photosensitive organic component has a thickness of 100 μm. The haze is preferably 0.5 or less.

The group represented by $X_4$ in formula (2) preferably has a total molecular weight of 800 to 10000, the total molecular weight being obtained by multiplying the formula weight of the group, represented by $X_4$, by n. When the total molecular weight is 800 or more, the urethane compound is flexible. When the total molecular weight is 10000 or less, the urethane compound can be readily handled.

The organic group, represented by $X_3$, having the urethane bond is preferably formed by the condensation of a diisocyanate group and a hydroxyl group. Examples of a compound having the diisocyanate group used herein include an aliphatic diisocyanate compound such as 1,4-diisocyanatebutane and 1,6-diisocyanatehexan, an aromatic diisocyanate compound such as 1,4-phenylenediisocyanate and tolylenediisocyanate, and a cycloaliphatic diisocyanate compound such as isophoronediisocyanate. In particular, isophoronediisocyanate is preferable; however, the compound having the diisocyanate group is not limited thereto.

Examples of the urethane compound, used herein, having the ethylenic unsaturated group include UA-2235PE (a molecular weight of 14000 and an ethylene oxide (EO) content of 20%), UA-3238PE (a molecular weight of 19000 and an EO content of 10%), UA-3348PE (a molecular weight of 22000 and an EO content of 15%), UA-5348PE (a molecular weight of 39000 and an EO content of 23%), TN-1 (a molecular weight of 1000), TN-5 (a molecular weight of 2000), UV-6100B (a molecular weight of 6500), and UV-7000B (a molecular weight of 3500). UA-2235PE, UA-3238PE, UA-3348PE, and UA-5348PE are available from Shin-Nakamura Chemical Co., Ltd.; TN-1 and TN-5 are available from Negami Chemical Industrial Co., Ltd.; and UV-6100B and UV-7000B are available from The Nippon Synthetic Chemical Industry Co., Ltd.

The photosensitive organic component (component A) used herein preferably contains the polymer (sub-component A3) with the side chains having the carboxyl group because the photosensitive organic component can be developed with an alkaline solution. The polymer (sub-component A3) with the side chains having the carboxyl group can be obtained by polymerizing or copolymerizing a carboxyl group-containing monomer such as acrylic acid, methacrylic acid, itaconic acid, crotonic acid, maleic acid, fumaric acid, vinyl acetate, or an acid anhydride derived from any one of those compounds; and/or a monomer such as methacrylic ester, acrylic ester, styrene, acrylonitrile, vinyl acetate, 2-hydroxyethyl acrylate using a radical polymerization initiator. A monomer for preparing the polymer is not limited to those monomers.

The polymer (sub-component A3) with the side chains having the carboxyl group preferably has an acid value of 50 to 140. When the acid value is 140 or less, the photosensitive organic component can be readily developed. When acid value is 50 or more, a fine pattern can be obtained because unexposed regions are soluble in a developing solution, which need not therefore have high concentration, and such a solution does not cause damage in exposed regions. Preferable examples of the polymer (sub-component A3) with the side chains having the carboxyl group a copolymer prepared by copolymerizing (meth)acrylic ester and (meth) acrylic acid because such a copolymer is thermally decomposed at low temperature when fired.

In common with the urethane compound having the ethylenic unsaturated group, the polymer (sub-component A3) with the side chains having the carboxyl group preferably has side chains having an ethylenic unsaturated group because a pattern can be readily formed. A configuration of the polymer (sub-component A3) having the side chains having the ethylenic unsaturated group is substantially the same as that of the urethane compound having the ethylenic unsaturated group.

The content of the polymer (sub-component A3) in the photosensitive organic component is preferably 10% to 80% by weight. When the polymer content is less than the lower limit of the above range, the degree of photo-curing is insufficient. When the polymer content is more than the upper limit of the range, the degree of photo-curing is excessively high. The polymer content outside the range is not preferable.

The polymer (sub-component A3) with the side chains having the carboxyl group and the urethane compound (sub-component A2) having the ethylenic unsaturated group, which are contained in the photosensitive organic component, are inferior in absorbing the energy of light rays used for activation in general. Therefore, in order to initiate a photoreaction, the photosensitive organic component preferably contains a photo-polymerization initiator. The photosensitive organic component may further contain an enhancer for assisting the photo-polymerization initiator in some cases. Examples of the photo-polymerization initiator include an initiator in which a single molecule is directly cleaved, an initiator in which electrons transferred between ion pairs, a hydrogen transfer initiator, and a bimolecular initiator. The photo-polymerization initiator used herein preferably produces active radicals. One or more species of photo-polymerization initiator and/or enhancer may be used. The content of the photo-polymerization initiator in the photosensitive organic component is preferably 0.05% to 10% and more preferably 0.1% to 10% on a weight basis. When the initiator content is within the above range, the residue of exposed regions is within a desired range and the sensitivity is satisfactory.

The content of the photosensitive organic component in the photosensitive ceramic composite is preferably 10% to 40% by weight while the photosensitive organic component contains the organic solvent. When the photosensitive organic component is formed into coatings or green sheets, the flexibility and ventilation thereof must be satisfied. The component of the photosensitive organic component affects those characteristics. In order to enhance the flexibility, the component of the photosensitive organic component is preferably high; however, spaces between the inorganic particles are filled with the photosensitive organic component and the ventilation is impaired when the content is excessively high. Thus, the component of the photosensitive organic component is more preferably 20% to 35% by weight.

The photosensitive ceramic composite of the present invention can be prepared according to the procedure below.

The sections containing the material having low refractive index are each formed on the corresponding inorganic particles.

In order to form each section, containing the material having low refractive index, on at least one area of the surface of each inorganic particle, the following method is preferably used: a method for forming the section on the inorganic particle surface in a gas atmosphere or a vacuum atmosphere by a spray coating process or a vacuum vapor deposition process or a method for forming the sections by applying a solution in which a compound or precursor forming the sections is dissolved or dispersed onto the inorganic particles and then evaporating a solvent of the solution or applying light or heat to the resulting inorganic particles to allow a chemical reaction in the solution on the inorganic particles.

In a process using a spray dryer, a liquid containing the material having low refractive index is sprayed from nozzles on the inorganic particles placed on a hot plate or placed in a hot air stream and the liquid placed on the particle surface is then instantaneously dried.

In the vacuum vapor deposition process, a metal or nonmetal piece is subjected to evaporation in a high vacuum atmosphere by heating and vapor evaporated from the piece, which is an evaporation source, is allowed to adhere to the inorganic particles, which are evaporation targets. Since the evaporation is performed under vacuum conditions, the degree of vacuum is preferably maintained high such that the distance between a heater and the evaporation targets is sufficiently smaller than the mean free path of evaporated molecules and absorbed moisture is preferably removed completely by cleaning surfaces. On the other hand, in order to deposit an oxide or nitride on the inorganic particles, a small amount of an oxygen or nitrogen gas is introduced into the atmosphere, an evaporated or vaporized substance is allowed to react with oxygen or nitrogen, and the product is deposited on the inorganic particles.

In a process for preparing a solution to allowing the solution to adhere to the inorganic particle surface, the amount of the solution adhering to the inorganic particle surface can be controlled by varying the composition or concentration of the solution and a large amount of the inorganic particles can be surface-treated by mixing the inorganic particles with the solution. When a low-refractive index material containing $SiO_2$ is formed, the solution is preferably prepared by dissolving a large amount of alkali silicate, obtained by melting silicon dioxide and alkali, in water, the solution being referred to as water glass. Alternatively, the solution is preferably prepared by dispersing inorganic powder, synthesized physically or chemically in advance, in a dispersion medium such as water or an organic solvent. In order to enhance the adhesion of the solution to the inorganic particles, the solution may contain 0.01% to 3.0% by weight of a silane coupling agent.

There are various processes as described above. The easiest one is a process of preparing a solution containing a low-refractive index compound and then mixing the solution with the inorganic particles to allowing the solution adhere to the inorganic particles. The mixture is then filtrated by aspiration, and the resulting inorganic particles are dried in an oven.

An organic vehicle is then prepared by mixing the photosensitive organic component (for example, the polymer with the side chains having the carboxyl group, the photo-polymerization initiator, and the like) with a solvent and/or an additive according to needs and then filtrating the mixture. The inorganic particles pretreated according to needs and an inorganic compound functioning as a filler are mixed with the organic vehicle using a kneader such as a ball mill such that the inorganic particles and the inorganic compound are uniformly dispersed in the organic vehicle, whereby the photosensitive ceramic composite, which is slurry or paste, is prepared. The viscosity of the slurry or paste is adjusted by varying the blending ratio of the inorganic particles to the organic component, the amount of the organic solvent, and/or the content of an additive such as a plasticizer according to needs and is preferably within a range of 1 to 5 Pa·s. The solvent for preparing the slurry or paste is not particularly limited and any solvent having an ability to dissolve the photosensitive organic component may be used. Examples of the solvent include methyl cellosolve, ethyl cellosolve, butyl cellosolve, methyl ethyl ketone, dioxane, acetone, cyclohexanone, cyclopentanone, isobutyl alcohol, isopropyl alcohol, tetrahydrofuran, dimethyl sulfoxide, γ-butyrolactone, toluene, trichloroethylene, methyl isobutyl ketone, and isophorone. Those compounds may be used alone or in combination.

The obtained paste is applied onto a film, for example, a polyester film, by an ordinary process such as a doctor blade process or an extrusion-molding process, whereby layers having a thickness of 0.05 to 0.5 mm are formed. The solvent is removed from the layers, whereby green sheets containing the photosensitive ceramic composite are prepared. Via-holes are formed according to the following procedure: the green sheets are subjected to pattern exposure using a photomask having a pattern for forming the via-holes and the resulting green sheets are developed with an alkali solution.

In the present invention, since the photosensitive organic component contained in the photosensitive ceramic composite contains the polymer (sub-component A3) with the side chains having the carboxyl group, the photosensitive organic component can be developed with an alkali solution. Examples of the alkali solution include a metal alkali solution containing sodium or potassium and an organic alkali solution. In particular, the following solution is preferable: a solution containing a weakly basic metal alkali compound such as sodium carbonate ($Na_2CO_3$) or potassium carbonate ($K_2CO_3$) or a solution containing an organic amine compound having no hydroxy group but one to six carbon atoms, the organic amine compound being at least one selected from the group consisting of n-propylamine, t-butylamine, and diisopropylamine. This is because a change in the size of the green sheets can be controlled within a range of 1 to 1.5 (more preferably 1 to 1.3 and further more preferably 1 to 1.2). The concentration of the alkali solution is usually 0.1% to 3% and more preferably 0.5% to 1.5% on a weight basis. When the concentration is extremely low, soluble portions of the green sheets cannot be completely removed. When the concentration is extremely high, a pattern formed by exposure is removed and/or eroded in some cases. The temperature of the development is preferably 20° C. to 50° C. in view of the process management. Examples of a developing process include ordinary processes such as an immersing process and a spraying process. The developing time can be reduced and unevenness in development can be prevented by the use of ultrasonic waves.

A method for manufacturing a substrate using the photosensitive ceramic composite containing the inorganic particles and the photosensitive organic component includes the following steps:

(1) a step of forming the photosensitive ceramic composite into photosensitive green sheets;

(2) a step of trimming the resulting photosensitive green sheets by a photolithographic process;

(3) a step of stacking the resulting photosensitive green sheets; and (4) a step of firing the resulting photosensitive green sheets.

In the above method, the term "a step of trimming the resulting photosensitive green sheets by a photolithographic process" is defined as a step of shaping an outside region of the photosensitive green sheets formed into the sheets or a step of shaping the outlines (including inside end regions) of the green sheets functioning as dielectric layers, wherein the outlines do not include those of pores such as perforations used for forming contact holes such as via-holes.

As a matter of course, the outside region is defined as a side face of the substrate (or an electronic circuit) that can be observed in the direction perpendicular to a normal line of the substrate. Furthermore, a principal face of the substrate is defined as an upper face thereof when the substrate is assumed to be substantially a flat sheet. Alternatively, the principal face is defined as a face having a normal line extending in the direction that a maximum value is obtained when sizes of lines normal to outer faces of the substrate are summed up, wherein the normal lines are assumed to have a size that is in proportion to the area of each outer face. The outlines except for those of such pores correspond to those of holes larger than the via-holes (the maximum diameter is 300 μm) and include openings, perforated structures, and structures similar to a patio.

In the above configuration, the photosensitive green sheets trimmed by the photolithographic process each have a processed region and the area of the processed region is substantially the same as that of a circle having a diameter of 1 to 50 mm preferably (more preferably 5 to 40 mm and further more preferably 10 to 30 mm). The diameter is less than the lower limit of the above range, the reproducibility of the cross-sectional shape is lowered, that is, the processing accuracy is lowered. In contrast, when the diameter is more than the upper limit of the above range, stress is concentrated on irregularities formed in the trimming step, whereby warpage occurs in the firing step. Therefore, the diameter outside the above range is not preferable. On the other hand, for the shape of the photosensitive green sheets trimmed by the photolithographic process, the following formula is preferably satisfied:

$$3 \text{ mm} \leq L \leq 200 \text{ mm}$$

wherein L represents the sum of the outside perimeter and inside perimeter of each sheet trimmed by the photolithographic process and the length of a portion common to an outside region and an inside region of the sheet is excluded from the sum. The sum L is more preferably 12 to 100 mm.

In order to prepare a substrate including isolated portions in cross section parallel to a principal face of the substrate (or an electronic circuit), the trimming step using the photolithographic process may include the sub-steps below.

(1) First, the photosensitive green sheets are arranged on a carrier film.

(2) Secondly, the photosensitive green sheets on the carrier film are trimmed by the photolithographic process, and the resulting photosensitive green sheets are processed such that the sheets each include portions isolated each other as described above. The processing is performed such that the arrangement of the isolated portions on the carrier sheet corresponds to that in the completed substrate.

(3) Thirdly, the sheets including the isolated portions obtained by the photolithographic process are transferred from the carrier film while the arrangement the isolated portions is maintained, and the resulting sheets are stacked.

(4) Finally, the stacked ceramic green sheets are fired.

According to the above procedure, the substrate having the branched structure can be readily prepared. This is because the photosensitive green sheets isolated each other can be arranged on the single carrier film while the arrangement of the isolated portions is maintained. In contrast, in a punching process using a die, since the photosensitive green sheets are punched together with the carrier film, a plurality of the trimmed sheets must be individually aligned with the die. In the present invention, since the photosensitive green sheets can be formed on the single carrier film and the resulting sheets can be stacked, the photosensitive green sheets can be precisely aligned with each other readily when stacked.

In the present invention, the term "a step of stacking the photosensitive green sheets trimmed by the photolithographic process" is defined as a step of stacking at least one or more trimmed photosensitive green sheets or non-photosensitive green sheets containing the inorganic particles and a non-photosensitive organic component. Since the photolithographic process has limitations on the depth, thin sheets are processed by the photolithographic process and then stacked, whereby a substrate having a desired thickness can be obtained. The photosensitive green sheets preferably have a thickness of 10 to 500 μm (more preferably 25 to 400 μm and further more preferably 50 to 300 μm). When the sheet thickness is less than the lower limit of the above range, the sheets are inferior in portability and cracks are therefore formed in the sheets. In contrast, when the sheet thickness is more than the upper limit of the above range, walls of the sheets cannot be processed by the photolithographic process. Thus, the sheet thickness outside the above range is not preferable. The substrate including the stacked sheets preferably has a thickness of 50 to 3000 μm (more preferably 100 to 2500 μm and further more preferably 400 to 2000 μm). When the substrate thickness is less than the lower limit of the above range, unevenness in thickness occurs in the stacking step. In contrast, when the substrate thickness is more than the upper limit of the above range, the substrate cannot be uniformly fired because the organic component remains inside the substrate and is gasified in the firing step; hence, cavities are caused in the substrate by the resulting component. Thus, the substrate thickness outside the above range is not preferable.

In the present invention, the step of firing the stacked ceramic green sheets includes a sub-step of placing the stacked sheets in a firing furnace such as a muffle furnace to gasify the organic component remaining in the sheets, the sub-step being usually referred to as a degreasing sub-step. The step further includes a sub-step of allowing at least one or more inorganic compounds to migrate to partially crystallize the compounds, this sub-step being performed after the degreasing sub-step and usually referred to as a firing or sintering sub-step.

In the manufacturing method of the present invention, the sheets are preferably stacked such that there are substantially no outer faces that face each other and are arranged substantially in parallel to the normal line of the principal face of the ceramic multilayer substrate, the outer faces being different from faces between the stacked sheets. In the present invention, the photosensitive green sheets trimmed by the photolithographic process preferably have an area that is less than or equal to that of outer regions of sheets placed at a lower portion of the substrate. This is because deformation hardly occurs in the firing step and the reproducibility of the shape is high. In the present invention, the lower sheets are principally defined as sheets stacked in advance. In the completed multilayer substrate, the lower sheets are placed at the side opposite to that of the electronic circuit.

The term "there are substantially no outer faces" means that there are an extremely small number of the outer faces that face each other and are arranged substantially in parallel. The area of the outer faces is not particularly limited and is preferably 250000 μm$^2$ or less. Alternatively, the outer faces facing each other preferably have a width of 1000 μm or less when the width is measured in the direction parallel to the normal line perpendicular to a face that is adjacent to and substantially perpendicular to the outer faces, wherein the width can be assumed to be the shortest distance between faces that are adjacent to and substantially perpendicular to the outer faces facing each other. Alternatively, a face of which the width is more than 1000 μm preferably has a length of 500 μm or less, the width being measured in the direction perpendicular to the principal face of the substrate.

In the photosensitive green sheets trimmed by the photolithographic process and the lower sheets, when patterns of most outer regions and/or inner end regions are different from each other, the following formula is preferably satisfied:

$$0.01 \leq A/B \leq 0.90$$

wherein A represents the area of each photosensitive green sheet and B represents the area of each lower sheet. The value of A/B is more preferably 0.25 to 0.75.

In the firing step, the stacked ceramic green sheets are preferably fired such that the sheets are not shrunk. This is because the non-shrinkage firing does not cause distortion and breakage in the circuit but allows the shape of the sheets, precisely trimmed by the photolithographic process, to be maintained; hence, a difference in the design shape and the shape of the fired sheets can be reduced.

In the non-shrinkage firing, the fired substrate has a shrinkage of 5% or less in the X-axis direction and also in the Y-axis direction when a face of the substrate is defined using the X-Y coordinate plane. In usual isotropic shrinkage, the shrinkage of a side is 10% to 15%. Therefore, if the shrinkage can be controlled within 5% or less, the distortion and breakage of the circuit can be efficiently prevented. When the green sheets are fired in such a manner that each green sheet is placed between, for example, binding sheets containing a sintering-resistant ceramic component, the shrinkage is prevented in the direction perpendicular to the X-Y plane; however, the shrinkage unavoidably occurs due to the composition of the composite, components in the composite, and firing conditions. Thus, if the shrinkage can be controlled within 1% or less, non-shrinkage can be assumed to be achieved. The shrinkage is more preferably 0.5% or less and further more preferably 0.1% or less. Such conditions are applicable to coatings, which can be fired in such a manner that such a binder sheet is placed on the upper face of each coating.

As described above, the multilayer substrate can be prepared according to the following procedure: the photosensitive ceramic composite is formed into the green sheets, which are trimmed by the photolithographic process, stacked, and then fired. Known glass ceramic substrates cannot be precisely processed, whereas the multilayer substrate can be done. As described as the object, the multilayer substrate is fit for a housing of a mobile electronic apparatus and can be placed in such a housing having a small packaging volume. When the multilayer substrate has a simple rectangular parallelepiped shape, the substrate cannot be placed in the housing. However, in the multilayer substrate, particular portions can be precisely removed freely. Furthermore, electronic circuits can be formed in the perforated structures.

EXAMPLES

The present invention will now be described in detail with reference to examples. The present invention is not limited to the examples.

(1) Enhancement of Photolithographic Properties by Use of Low-Refractive Index Material The refractive index is a measurement obtained using the sodium D line unless otherwise specified. Inorganic particles and an organic component used in the examples are described below.

A. Inorganic Particles

Inorganic Particles I:

Ceramic particle mixture consisting of 49.8% of alumina particles and 50.2% of glass particles Characteristics of the alumina particles: an average particle size of 2 μm and a refractive index of 1.78 (a measurement obtained using the sodium D line)

Composition of the glass particles: 10.8% of $Al_2O_3$, 51.5% of $SiO_2$, 15.6% of PbO, 7.1% of CaO, 2.86% of MgO, 3% of $Na_2O$, 2% of $Ka_2O$, and, 5.3% of $B_2O_3$ Characteristics of the glass particles: a glass transition point of 565° C., a thermal expansion coefficient of $60.5 \times 10^{-7}$/K, a dielectric constant of 8.0 (1 MHz), an average particle size of 2 μm, and a refractive index of 1.58 (a measurement obtained using the sodium D line)

Inorganic Particles II:

$Al_2O_3$—$SiO_2$—$B_2O_3$ glass particles

Composition of the glass particles: 8.7% of $Al_2O_3$, 67% of $SiO_2$, 2.7% of $ZrO_2$, 1.6% of $Ka_2O$, and 12.5% of $B_2O_3$ Characteristics of the glass particles: a glass transition point of 500° C., a thermal expansion coefficient of $42 \times 10^{-7}$/K, a dielectric constant of 4.7 (1 MHz), an average particle size of 3 μm, and a refractive index of 1.68

B. Different Surface Material Placed on Inorganic Particle Surface

In order to coat inorganic particles with a solution, organosol was prepared and then used. The average particle size of particles in the organosol was determined with the LB-500 dynamic light-scattering particle size distribution analyzer manufactured by Horiba Ltd. The organosol was dried and the refractive index thereof was determined by an immersion method.

Coating Material I: $ZrO_2$ sol (an average particle size of 12 nm), a γ-butyrolactone solvent, a concentration of 11%, and a refractive index of 2.0, the refractive index being measured in a dry state Coating Material II: $TiO_2$ sol (an average particle size of 7 nm), a propylene glycol solvent, a concentration of 21%, and a refractive index of 2.3, the refractive index being measured in a dry state Coating Material III: $CeO_2$ sol (an average particle size of 17 nm), a benzyl alcohol solvent, a concentration of 12%, and a refractive index of 2.3, the refractive index being measured in a dry state Coating Material IV: $Ta_2O_5$ sol (an average particle size of 14 nm), a benzyl alcohol solvent, a concentration of 19%, and a refractive index of 2.0, the refractive index being measured in a dry state Coating Material V: $Y_2O_3$ sol (an average particle size of 19 nm), a γ-butyrolactone solvent, a concentration of 25%, and a refractive index of 2.0, the refractive index being measured in a dry state Coating Material VI: ZnS sol (an average particle size of 13 nm), a γ-butyrolactone solvent, a concentration of 18%, and a refractive index of 2.2, the refractive index being measured in a dry state Coating Material VII: $Al_2O_3$ sol (an average particle size of 9 nm), a propylene glycol solvent, a concentration of 9%, and a refractive index of 1.7, the refractive index being measured in a dry state Coating Material VIII: $CeF_2$ sol (an average particle size of 17 nm), a butanol solvent, a concentration of 22%, and a refractive index of 1.6, the refractive index being measured in a dry state Coating Material IX: $MgF_2$ sol (an average particle size of 19 nm), an ethanol solvent, a concentration of 14%, and a refractive index of 1.4, the refractive index being measured in a dry state Coating Material X: $SiO_2$ sol (an average particle size of 8 nm), a γ-butyrolactone solvent, a concentration of 20%, and a refractive index of 1.4, the refractive index being measured in a dry state C. Photosensitive Organic Component Polymer 1: a polymer, having a weight-average molecular weight of 43,000 and an acid value of 95, prepared by allowing 0.4 equivalent of glycidyl methacrylate to react with one equivalent of a carboxyl group of a copolymer prepared using 40% of methacrylic acid, 30% of methyl methacrylate, and 30% of styrene on a weight basis Photoreactive Compound 1: bis(2-hydroxy-3-methacryloyloxypropyl) isopropylamine (GMPA)

Photoreactive Compound 2: TN-1 (urethane polymer, manufactured by Negami Chemical Industrial Co., Ltd., having a molecular weight of about 12,000)

Photoreactive Compound 3: bis(4-methacryloylthiophenyl) sulfide (high-refractive index monomer MPSMA, manufactured by Sumitomo Seika Chemicals Co., Ltd.)

Photopolymerization Initiator: IC-369 (Irgacure-369 manufactured by Chiba Geigy Co., Ltd)

Solvent: solvent mixture of 90% methyl ethyl ketone and 10% n-butylalcohol

D. Preparation of Organic Vehicle

A solvent and a polymer were mixed and the mixture was heated to 60° C. while agitated, whereby the polymer was completely dissolved in the solvent. The solution was cooled to room temperature, and a photoreactive compound and a photopolymerization initiator were dissolved in the solution. The resulting solution was degassed under vacuum conditions and then filtrated with a 250-mesh filter, whereby an organic vehicle was prepared. The solution contained 10 parts of the polymer, 10 parts of the photoreactive compound (the total compound content is employed when a plurality of photoreactive compounds are used), and 3.5 parts of the photopolymerization initiator on a weight basis.

E. Treatment of Inorganic Particles

Sections containing a different surface material were each formed on the surfaces of inorganic particles using the solution. A preparation procedure was as follows: the inorganic particles used herein and a coating agent were mixed, the mixture was agitated for one hour at room temperature, the resulting mixture was filtrated with a sheet of filter paper (type GF/B, manufactured by Whatman Inc.) by aspiration, and the obtained cake was heated to 500° C. in a muffle furnace.

The state of the different surface material on the inorganic particle surface was observed with a scanning electron microscope, and the thickness of each section containing the different surface material was determined with a transmission electron microscope.

F. Preparation of Paste

Inorganic particles were blended with the organic vehicle, the blend being hereinafter referred to as powder blend. The powder blend was wet-mixed for 20 hours in a ball mill, whereby paste was prepared. The amount of the polymer and photoreactive compound, which are contained in the organic vehicle, was 20 parts by weight and the amount of the powder blend was 80 parts by weight.

G. Preparation of Green Sheets

Green sheets were formed in a chamber, shielded from UV rays, by a doctor blade process in such a manner that the distance between a polyester carrier film and a blade is 0.1 to 0.8 mm and the forming rate is 0.2 m/min. The sheet thickness was 100, 150, or 200 µm.

H. Determination of Light Transmittance

In order to prepare samples for determining the light transmittance, green sheets were prepared in the same manner as the above. The green sheets had a thickness of 50 µm. Each green sheet was cut into 40-mm square pieces, and the pieces were heated at 80° C. for one hour, whereby a solvent was evaporated. The light transmittance of the obtained samples were measured with a haze computer, model HGM-2DP, manufactured by Suga Test Instruments Co. Measurement items are the total beam transmittance and the rectilinear beam transmittance. The total beam transmittance is defined as the percentage of the amount of light, passing through each sample, in the amount of light applied to the sample. The rectilinear beam transmittance is defined as the percentage of the amount of light, rectilinearly traveling through each sample without changing the path, in the amount of light applied to the sample. When the total beam transmittance is high, the clarity is high; hence, exposure light can arrive at a deep area of a sheet having a large thickness. When the rectilinear beam transmittance is high, a pattern of a photomask can be precisely transferred; hence, via-holes formed by exposure and development have substantially a rectangular shape in cross section. An increase in total beam transmittance allows perforations to be formed in thick sheets and an increase in rectilinear beam transmittance allows via-holes having a high aspect ratio in cross section to be formed.

I. Formation of Via-Holes

The green sheets were each cut into 100-mm square pieces, and the pieces were heated at 80° C. for one hour, whereby a solvent was evaporated. In order to form a pattern, each piece was exposed for one minute using an ultra high-pressure mercury vapor lamp having an output of 15 to 25 mW/cm$^2$ in such a manner that a chromium mask having a via-hole diameter of 30 to 100 µm and a via-hole pitch of 500 µm was directly placed on the upper face of the piece and light was applied thereto. The resulting piece was developed at 25° C. with an aqueous solution containing 0.5% by weight of monoethanolamine, and formed via-holes were cleaned using a spray.

J. Preparation of Binding Sheets Used for Firing

Paste was prepared by mixing aluminum particles, zirconia particles, or magnesia particles with polyvinyl butyral, dioctyl phthalate, an organic solvent, and the like. The paste was formed into sheets by a doctor blade process.

K. Preparation of Multilayer Substrates

Five or six green sheets containing the photosensitive ceramic composite of the present invention were stacked, and the resulting green sheets were placed between binding sheets for non-shrinkage firing and then heat-pressed at 80° C. with a pressure of 150 kg/cm$^2$. The resulting sheets were fired at 900° C. for 30 minutes in an air atmosphere, whereby multilayer substrates were prepared. The shrinkage caused by firing was measured for the X-Y plane.

L. Measurement of Dielectric Constant

The dielectric constant was measured with a network analyzer and an impedance analyzer or a cavity resonator.

Example 1

Sections containing a different surface material were formed on the surfaces of Inorganic Particles I using Coating Material X to be converted into the different surface material. The resulting particles were observed with a scanning electron microscope and the observation showed that $SiO_2$ derived from Coating Material X was present on the particle surfaces. Furthermore, the particles were observed with a transmission electron microscope and the observation showed that $SiO_2$ layers had a thickness of 70 nm. The treated particles were used as an inorganic-particle source material.

Samples for evaluating the light transmittance and green sheets having a thickness of 100 µm were prepared using the following materials and compounds: the inorganic-particle source material (70%), Polymer 1 (15%) functioning as a photosensitive organic component, Photoreactive Compound 1 (5%), Photoreactive Compound 2 (5%), Photoreactive Compound 3 (5%), and a photopolymerization initiator. The measurement of the light transmittance showed that each sample had a total beam transmittance of 60% and a rectilinear beam transmittance of 6.5%.

The formation of via-holes was attempted, whereby 30-µm via-holes were formed in the green sheets. After the resulting sheets were cured, the resulting sheets were placed between alumina binding sheets and then fired at 900° C. for 30 minutes, whereby a white multilayer substrate was obtained. The substrate had no cracks but had a bending strength of 270 MPa. The dielectric constant was 7.8 (1 MHz).

Furthermore, 200-µm green sheets were prepared. The formation of via-holes was attempted, whereby 50-µm via-holes were formed in the green sheets.

Examples 2a to 2h

The content of the γ-butyrolactone solvent in Coating Material X used in Example 1 was varied as shown in Table 1. Samples for evaluating the light transmittance and green sheets having a thickness of 100 µm were prepared using resulting Coating Material X. Results shown in Table 1 were obtained.

TABLE 1

|  | Example 2a | Example 2b | Example 2c | Example 2d | Example 2e | Example 2f | Example 2g | Example 2h |
|---|---|---|---|---|---|---|---|---|
| Concentration (%) | 3 | 7 | 12 | 20 | 27 | 32 | 38 | 48 |
| Layer Thickness (nm) | 2 | 7 | 50 | 70 | 120 | 190 | 220 | 270 |
| Total Beam Transmittance (%) | 26 | 34 | 58 | 60 | 62 | 43 | 28 | 25 |
| Rectilinear Beam Transmittance (%) | 1.5 | 3.6 | 7.2 | 6.5 | 8.6 | 3.8 | 2.6 | 1.5 |
| Via-hole Diameter (μm) | 100 | 85 | 50 | 30 | 30 | 75 | 100 | 100 |

Table 1 shows that light transmission characteristics and a via-hole forming characteristic are varied depending on the change in the thickness of each section containing the different surface material.

Examples 3a to 3j

Only the aluminum particles for Inorganic Particles I were treated with each of Coating Materials I to X and the resulting aluminum particles were mixed with the glass particles for Inorganic Particles I, whereby a inorganic-particle source material was prepared. In common with Example 1, an organic vehicle was prepared and green sheets having a thickness of 100 μm and samples for evaluating light transmission characteristics were prepared. The evaluation of the light transmission characteristics and the evaluation of a via-hole forming characteristic provided the results shown in Table 2.

material contains a different surface material having a refractive index less than or equal to the refractive index (1.7 to 1.8) of the aluminum particles.

Examples 4a to 4g

In common with Example 1, an inorganic-particle source material was prepared by forming sections, containing a different surface material, on the surfaces of inorganic particles except that Inorganic Particles II are prepared and then crashed into small particles having different average particle sizes, and the small particles are treated with Coating Material VIII. Samples for evaluating light transmission characteristics and green sheets having a thickness of 100 μm were prepared and they were subjected to evaluation in

TABLE 2

|  | Example 3a | Example 3b | Example 3c | Example 3d | Example 3e | Example 3f | Example 3g | Example 3h | Example 3i | Example 3j |
|---|---|---|---|---|---|---|---|---|---|---|
| Coating Material | I | II | III | IV | V | VI | VII | VIII | IX | X |
| Layer Thickness (nm) | 40 | 90 | 50 | 60 | 100 | 60 | 80 | 110 | 90 | 70 |
| Total Beam Transmittance (%) | 36 | 32 | 35 | 37 | 39 | 34 | 41 | 55 | 50 | 60 |
| Rectilinear Beam Transmittance (%) | 4.1 | 3.2 | 3.5 | 4.0 | 4.2 | 3.9 | 5.0 | 6.3 | 6.2 | 6.5 |
| Via-hole Diameter (μm) | 70 | 80 | 75 | 70 | 70 | 50 | 45 | 30 | 30 | 30 |

Table 2 shows that the light transmission characteristics are high and via-holes have a small diameter when a coating the same manner as that of Example 1. Obtained results are shown in Table 3.

TABLE 3

|  | Example 4a | Example 4b | Example 4c | Example 4d | Example 4e | Example 4f | Example 4g |
|---|---|---|---|---|---|---|---|
| Average Particle Size (μm) | 0.11 | 0.32 | 0.6 | 3.4 | 4.8 | 8.5 | 12 |
| Total Beam Transmittance (%) | 32 | 36 | 42 | 55 | 51 | 40 | 29 |

TABLE 3-continued

| | Example 4a | Example 4b | Example 4c | Example 4d | Example 4e | Example 4f | Example 4g |
|---|---|---|---|---|---|---|---|
| Rectilinear Beam Transmittance (%) | 2.9 | 3.0 | 4.1 | 5.2 | 4.6 | 2.8 | 2.2 |
| Via-hole Diameter (μm) | 100 | 70 | 50 | 50 | 75 | 90 | 100 |

Table 3 shows that the light transmission characteristics and the diameter of formed via-holes vary depending on the average particle size. When the average particle size was small, a mixture of an inorganic-particle source material and an organic component had extremely high viscosity and particles remained on the surfaces of the prepared green sheets. In contrast, when the average particle size was large, the green sheets had large irregularities and there were large number of openings, formed by the removal of the particles, on walls of the via-holes formed by exposure and development.

(2) Enhancement of Flexibility, Compatibility, and Developability

A. Photosensitive Organic Component (Sub-Component A1)

Monomer I: para-cumylphenol acrylate modified with ethylene oxide (manufactured by TOAGOSEI Co., Ltd.)

Monomer II: bisphenol-A diacrylate modified with ethylene oxide (manufactured by TOAGOSEI Co., Ltd.)

Photopolymerization Initiator:
2-benzyl-dimethylamino-1-(4-morpholinophenyl)-butanone-1

(Sub-component A2)

Urethane Compound I: a compound, having a molecular weight of 19000 and containing 30% of an ethylene oxide unit, represented by the following formula (1'):

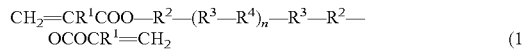

$$CH_2=CR^1COO-R^2-(R^3-R^4)_n-R^3-R^2-OCOCR^1=CH_2 \quad (1')$$

wherein $R^1$ represents hydrogen, $R^2$ represents an ethylene oxide group, $R^3$ represents an isophorone diisocyanate residue, and $R^4$ represents an ethylene oxide-propylene oxide cooligomer Urethane Compound II: a compound, having a molecular weight of 42000, represented by the above formula (1'), wherein $R^1$ represents hydrogen, $R^2$ represents a propylene oxide group, $R^3$ represents an isophorone diisocyanate residue, and $R^4$ represents a propylene oxide oligomer Urethane Compound III: urethane acrylate, UV6100B (manufactured by Nippon Synthetic Chemical Industry Co., Ltd.)

(Sub-Component A3)

Polymer I: a copolymer, prepared using 30% of styrene, 30% methyl methacrylate, and 40% of methacrylic acid and modified by allowing one equivalent of a carboxyl group thereof to react with 0.4 equivalent of glycidyl methacrylate, having a weight-average molecular weight of 43000 and an acid value of 95

Polymer II: a polymer, Cyclomer P (ACA) 250, manufactured by Daicel Chemical Industries Ltd., having a weight-average molecular weight of 10000 and an acid value of 75, the polymer being prepared by allowing 3,4-epoxycyclohexyl methacrylate to react with a copolymer obtained from methacrylic acid and methyl methacrylate B. Inorganic Particles Inorganic Particles I:
Composite ceramic consisting of 49.8% of alumina particles and 50.2% of glass particles
Characteristics of the alumina particles: an average particle size of 2 μm
Composition of the glass particles: 10.8% of $Al_2O_3$, 51.5% of $SiO_2$, 15.6% of PbO, 7.1% of CaO, 2.86% of MgO, 3% of $Na_2O$, 2% of $K_2O$, and 5.3% of $B_2O_3$
Characteristics of the glass particles: a glass transition point of 565° C., a thermal expansion coefficient of 60.5×$10^{-7}$/K, a dielectric constant of 8.0 (1 MHz), and an average particle size of 2 μm Inorganic Particles II:
$Al_2O_3$—$SiO_2$—$B_2O_3$ glass particles
Composition of the glass particles: 8.7% of $Al_2O_3$, 67% of $SiO_2$, 2.7% of $ZrO_2$, 1.6% of $K_2O$, and 12.5% of $B_2O_3$
Characteristics of the glass particles: a glass transition point of 500° C., a thermal expansion coefficient of 42×$10^{-7}$/K, a dielectric constant of 4.7 (1 MHz), and an average particle size of 3 μm Inorganic Particles III:
Composite ceramic consisting of 85% of $Al_2O_3$—$SiO_2$—$B_2O_3$ glass particles and 15% of quartz particles
Composition of the glass particles: 1.87% of $Al_2O_3$, 67.3% of $SiO_2$, 1.22% of $K_2O$, and 11.8% of $B_2O_3$
Characteristics of the glass particles: a glass transition point of 507° C., a thermal expansion coefficient of 46×$10^{-7}$/K, a dielectric constant of 4.6 (1 MHz), and an average particle size of 2.2 μm Inorganic Particles IV:
$Al_2O_3$—$SiO_2$—$B_2O_3$ composite ceramic
Composition of the ceramic: 0.34% of $Al_2O_3$, 84.3% of $SiO_2$, 1.29% of $K_2O$, and 11.7% of $B_2O_3$
Characteristics of the ceramic: a glass transition point of 509° C., a thermal expansion coefficient of 22×$10^{-7}$/K, a dielectric constant of 4.5 (1 MHz), and an average particle size of 2.5 μm Inorganic Particles V:
Composite ceramic (NKX-592J, manufactured by Nippon Ferro Co., Ltd.) consisting of 50% of alumina particles and 50% of glass particles
Characteristic of the alumina particles: an average particle size of 2 μm Composition of the glass particles: $Al_2O_3$—$B_2O_3$—$SiO_2$—CaO glass Characteristic of the glass particles: an average particle size of 4.8 µm Inorganic Particles VI:

Alumina-crystalline glass composite ceramic (FJ352J, manufactured by Nippon Ferro Co., Ltd.)

Composition of the glass particles: $Al_2O_3$—$B_2O_3$—$SiO_2$—CaO—ZnO glass

Characteristic of the glass particles: a glass transition point of 683° C., a thermal expansion coefficient of $52 \times 10^{-7}$/K, and an average particle size of 5 µm Inorganic Particles VII:

Crystalline glass (FJ351J, manufactured by Nippon Ferro Co., Ltd.)

Composition of the glass particles: $Al_2O_3$—$B_2O_3$—$SiO_2$—MgO glass

Characteristic of the glass particles: a glass transition point of 681° C., a thermal expansion coefficient of $90 \times 10^{-7}$/K, and an average particle size of 5 µm Inorganic Particles VIII:

Non-crystalline glass (K805, manufactured by Asahi Techno Glass Corporation)

Composition of the glass particles: $Al_2O_3$—$B_2O_3$—$SiO_2$ glass

Inorganic Particles IX:

Mixture consisting of 80% of glass particles and 20% of $SiO_2$ particles

Composition of the glass particles: $Al_2O_3$—$B_2O_3$—$SiO_2$ glass

C. Developing Solution

Developing Solution I: a 1.5% solution of sodium carbonate in water

Developing Solution II: a 0.5% solution of n-propylamine in water

Developing Solution III: a 0.5% solution of 2-aminoethanol in water

D. Preparation of Organic Vehicle

A polymer was mixed with a solvent and the mixture was heated to 60° C. while agitated, whereby the polymer was completely dissolved in the solvent. The solution was cooled to room temperature, and a urethane compound, a monomer, and a photopolymerization initiator were dissolved in the resulting solution. The resulting solution was degassed under vacuum conditions and then filtrated with a 250-mesh filter, whereby an organic vehicle was prepared.

E. Preparation of Paste

Inorganic particles were mixed with the organic vehicle, the mixture was wet-mixed for 20 hours in a ball mill, whereby slurry or paste was prepared. The slurry or paste contained 30 parts of the organic vehicle containing a photosensitive organic component and 70 parts of an inorganic component on a weight basis.

F. Preparation of Green Sheets

Green sheets were formed in a chamber, shielded from UV rays, by a doctor blade process in such a manner that the distance between a polyester carrier film and a blade is 0.1 to 0.8 mm and the forming rate is 0.2 m/min. The sheet thickness was 150 µm.

G. Formation of Via-Holes

Each green sheet was cut into 100-mm square pieces, and the pieces were heated at 80° C. for one hour, whereby a solvent was evaporated. In order to form a pattern, each piece was exposed for one minute using an ultra high-pressure mercury vapor lamp having an output of 15 to 25 mW/cm² in such a manner that a chromium mask having a via-hole diameter of 30 to 100 µm and a via-hole pitch of 500 µm was directly placed on the upper face of the piece and light was applied thereto. The resulting piece was developed with a developing solution maintained at 25° C., and formed via-holes were cleaned using a spray.

H. Determination of Variation

A pattern having a line width of 75 µm and a line pitch of 150 µm was formed on each green sheet having a thickness of 150 µm. An upper portion of a cross section of the resulting sheet was observed with a scanning electron microscope, the variation was measured along a line having a length of about 1 mm, and values of three samples were averaged.

I. Preparation of Binding Sheets Used for Firing

Paste was prepared by mixing aluminum particles, zirconia particles, or magnesia particles with polyvinyl butyral, dioctyl phthalate, an organic solvent, and the like. The paste was formed into sheets by a doctor blade process.

J. Preparation of Multilayer Substrates

Five or six green sheets containing the photosensitive ceramic composite of the present invention were stacked, and the resulting green sheets were placed between binding sheets for non-shrinkage firing and then heat-pressed at 80° C. with a pressure of 150 kg/cm². The resulting sheets were fired at 900° C. for 30 minutes in an air atmosphere, whereby multilayer substrates were prepared. The shrinkage caused by firing was measured for the X-Y plane.

K. Determination of Tensile Strength and Elongation of Green Sheets

Each green sheet was irradiated with activation rays with an optimum exposure value, whereby the sheet was cured. The resulting sheet was dried at 80° C. for 15 minutes. The following median was used for the optimum exposure value: the median of exposure values fit to form via-holes in sheets containing a photosensitive ceramic composite prepared by mixing inorganic particles and a photosensitive organic component. Obtained test pieces were dumbbell-shaped and had a width of 10 to 25 mm, a length of 40 to 100 mm, and a thickness of 0.1 to 0.2 mm. The test pieces were measured for tensile strength and elongation according to JIS K6301 using a tensile strength tester under the following conditions: a stretching rate of 50 mm/min, a temperature of 23° C., and a relative humidity of 50%. An average of measurements of ten test pieces was employed.

L. Determination of Dielectric Constant

The dielectric constant was measured with a network analyzer and an impedance analyzer or a cavity resonator.

M. Determination of Bending Strength and Cracks

The flexural strength was measured by a bending strength test method (JIS R1601). Surfaces of the test pieces were visually observed and the number of cracks were counted.

Example 5

Green sheets having a thickness of 150 µm were prepared using paste containing 70% of Inorganic Particles I, 15% of Polymer I functioning as a photosensitive organic component, 2% of Urethane Compound I, 5% of Monomer I, and a photopolymerization initiator. The formation of via-holes was attempted, whereby 75-µm via-holes were formed. Developing Solution I was used for the development. The haze of the photosensitive organic component was 0.1. The variation in line size was 1.2. The sheets were cured and then fired at 900° C. for 30 minutes using the alumina binding sheets, whereby a white multilayer substrate was obtained. The substrate had no cracks but had a bending strength of 270 MPa and a dielectric constant of 7.8 (1 MHz). The cured sheets had a tensile strength of 0.6 N/mm² and an elongation of 20%.

Examples 6 to 17

The procedure described in Example 5 was repeated using the components shown in Table 4. Test results are shown in Table 4. Samples have a small change in size and high strength.

Comparative Example 1

The procedure shown in Example 1 was repeated using paste containing 70% of Inorganic Particles I, 15% of Polymer I functioning as a photosensitive organic component, 2% of Urethane Compound I, 5% of Monomer I, and a photopolymerization initiator. Obtained sheets had a thickness of 150 µm, and Developing Solution III was used. The sheets had a change in size of 2.0, that is, the sheets were seriously swollen. The sheets were fired using the alumina binder sheets, whereby a white multilayer substrate was prepared. The substrate had cracks therein and had a bending strength of 150 MPa and a dielectric constant of 7.0 (1 MHz). The sheets cured or non-cured had a tensile elasticity modulus of 0.2 N/mm² and an elongation of 5%. The sheets and the substrate had insufficient strength.

Comparative Example 2

The procedure shown in Example 1 was repeated using paste containing 70% of Inorganic Particles I, 15% of Polymer I functioning as a photosensitive organic component, 2% of Urethane Compound II, 5% of Monomer I, and a photopolymerization initiator. Obtained sheets had a change in size of 1.8, that is, the sheets were seriously swollen. The sheets were fired using the alumina binder sheets, whereby a white multilayer substrate was prepared. The substrate had cracks therein and had a bending strength of 100 MPa and a dielectric constant of 6.5 (1 MHz). The sheets cured or non-cured had a tensile elasticity modulus of 0.1 N/mm² and an elongation of 3%. The sheets and the substrate had insufficient strength.

TABLE 4

|  | Example 5 | Example 6 | Example 7 | Example 8 | Example 9 |
|---|---|---|---|---|---|
| Polymer |  |  |  |  |  |
| Type | I | I | I | I | I |
| Pats by Weight | 15 | 15 | 15 | 15 | 15 |
| Urethane Compound |  |  |  |  |  |
| Type | I | I | I | I | I |
| Pats by Weight | 2 | 2 | 2 | 2 | 2 |
| Monomer |  |  |  |  |  |
| Type | I | I | I | I | I |
| Pats by Weight | 5 | 5 | 5 | 5 | 5 |
| Inorganic particles |  |  |  |  |  |
| Type | I | II | III | IV | V |
| Pats by Weight | 70 | 70 | 70 | 70 | 70 |
| Developing Solution |  |  |  |  |  |
| Type | I | I | I | I | I |
| Dimensional Change | 1.2 | 1.1 | 1 | 1.2 | 1.1 |
| Haze | 0.2 | 0.2 | 0.2 | 0.2 | 0.2 |
| Photocured Sheet |  |  |  |  |  |
| Tensile Strength (N/mm²) | 0.58 | 0.61 | 0.6 | 0.62 | 0.64 |
| Elongation (%) | 18 | 20 | 19 | 19 | 20 |
| Fired Sheet |  |  |  |  |  |
| Dielectric Constant (1 MHz) | 7.8 | 4.6 | 4.5 | 4.8 | 6.5 |
| Bending Strength of White Substrate (MPa) | 270 | 150 | 150 | 155 | 200 |
| Cracks (Number) | 0 | 0 | 0 | 0 | 0 |

|  | Example 10 | Example 11 | Example 12 | Example 13 | Example 14 |
|---|---|---|---|---|---|
| Polymer |  |  |  |  |  |
| Type | I | I | I | I | I |
| Pats by Weight | 15 | 15 | 15 | 15 | 15 |

TABLE 4-continued

| Urethane Compound | | | | | |
|---|---|---|---|---|---|
| Type | I | I | I | I | I |
| Pats by Weight | 2 | 2 | 2 | 2 | 2 |
| Monomer | | | | | |
| Type | I | I | I | I | I |
| Pats by Weight | 5 | 5 | 5 | 5 | 5 |
| Inorganic particles | | | | | |
| Type | VI | VII | VII | IX | I |
| Pats by Weight | 70 | 70 | 70 | 70 | 70 |
| Developing Solution | | | | | |
| Type | I | I | I | I | I |
| Dimensional Change | 1.3 | 1.3 | 1.1 | 1.2 | 1.2 |
| Haze | 0.2 | 0.2 | 0.2 | 0.2 | 0.2 |
| Photocured Sheet | | | | | |
| Tensile Strength (N/mm$^2$) | 0.64 | 0.64 | 0.6 | 0.64 | 0.59 |
| Elongation (%) | 20 | 20 | 21 | 19 | 20 |
| Fired Sheet | | | | | |
| Dielectric Constant (1 MHz) | 7.4 | 6.5 | 5 | 4.5 | 7.8 |
| Bending Strength of White Substrate (MPa) | 250 | 200 | 150 | 130 | 270 |
| Cracks (Number) | 0 | 0 | 0 | 0 | 0 |

| | Example 15 | Example 16 | Example 17 | Comparative Example 1 | Comparative Example 2 |
|---|---|---|---|---|---|
| Polymer | | | | | |
| Type | II | I | I | I | I |
| Pats by Weight | 15 | 15 | 15 | 15 | 15 |
| Urethane Compound | | | | | |
| Type | I | III | III | I | II |
| Pats by Weight | 2 | 2 | 2 | 2 | 2 |
| Monomer | | | | | |
| Type | I | II | II | I | I |
| Pats by Weight | 5 | 5 | 5 | 5 | 5 |
| Inorganic particles | | | | | |
| Type | I | I | II | III | III |
| Pats by Weight | 70 | 70 | 70 | 70 | 70 |
| Developing Solution | | | | | |
| Type | I | I | II | III | III |
| Dimensional Change | 1.2 | 1.2 | 1.1 | 2 | 1.8 |
| Haze | 0.1 | 0.1 | 0.1 | 0.1 | 10 |
| Photocured Sheet | | | | | |
| Tensile Strength (N/mm$^2$) | 0.62 | 0.64 | 0.64 | 0.2 | 0.1 |
| Elongation (%) | 21 | 222 | 22 | 5 | 3 |
| Fired Sheet | | | | | |
| Dielectric Constant (1 MHz) | 7.8 | 7.8 | 7.8 | 7.0 | 6.5 |

TABLE 4-continued

| | | | | | |
|---|---|---|---|---|---|
| Bending Strength of White Substrate (MPa) | 270 | 270 | 270 | 150 | 100 |
| Cracks (Number) | 0 | 0 | 0 | 10 | 20 |

(3) Processing Method, Manufacturing Method, and Performance of Multilayer Substrate Obtained by the Methods Components of a photosensitive ceramic composite will now be described.

A. Inorganic Powdery Component

An inorganic powdery component was prepared using a combination of inorganic particles having an average particle size of about 2 μm and fine particles having an average particle size of about 10 nm.

(Inorganic Particles)

The inorganic sub-components described below were used. The average particle size thereof was measured by a laser diffraction scattering method using an analyzer, Microtrac 9320 HRA (X-100), manufactured by Nikkiso Co., Ltd.

Inorganic Sub-component 1: $BaO$—$SiO_2$—$Al_2O_3$—$CaO$—$B_2O_3$ crystallized glass particles having an average particle size of 2.3 μm Inorganic Sub-component 2: a mixture consisting of 30% of silica particles and 70% of borosilicate glass particles containing 44% of $SiO_2$, 29% of $Al_2O_3$, 11% of MgO, 7% of ZnO, and 9% of $B_2O_3$ on a weight basis, the average particle size of the mixture being 2.0 μm Inorganic Sub-component 3: a mixture consisting of 50% by weight of borosilicate glass particles having the same composition as that of Inorganic Sub-component 2 and 50% by weight of spherical amorphous silica particles having an average particle size of 2 μm, the average particle size of the mixture being 1.9 μm Inorganic Sub-component 4: a mixture consisting of 45% of quartz particles, 20% of cordierite particles, and 35% of borosilicate glass particles having the same composition as that of Inorganic Sub-component 2 on a weight basis Inorganic Sub-component 5: a mixture consisting of 32% of amorphous silica particles, 23% of alumina-magnesia spinel particles, and 45% of borosilicate glass particles on a weight basis Inorganic Sub-component 6: a mixture consisting of 48% by weight of glass particles and 52% by weight of alumina particles, wherein the glass particles contain 34.5% of $Al_2O_3$, 38.2% of $SiO_2$, 9.2% of $B_2O_3$, 5.1% of BaO, 4.8% of MgO, 4.4% of CaO, and 2.1% of $TiO_2$ on a weight basis; the mixture has an average particle size of 2.2 μm; the alumina particles have an average particle size of 2.1 μm; the glass particles have a refractive index of 1.584, a sphericity of 80%, an average particle size of 2.5 μm, a maximum particle size of 13.1 μm, a specific surface area of 2.41 m²/g, a glass transition point of 652° C., and a softening point of 746° C.

(Inorganic Fine Particles)

The inorganic fine particles described below were used.

Fine Particles 1: silica fine particles having an average particle size of 0.005 μm Fine Particles 2: silica fine particles having an average particle size of 0.011 μm Fine Particles 3: silica fine particles having an average particle size of 0.025 μm Fine Particles 4: silica fine particles having an average particle size of 0.045 μm Fine Particles 5: silica fine particles having an average particle size of 0.065 μm Fine Particles 6: silica fine particles having an average particle size of 0.095 μm Fine Particles 7: alumina fine particles having an average particle size of 0.010 μm Fine Particles 8: alumina fine particles having an average particle size of 0.035 μm Fine Particles 9: alumina fine particles having an average particle size of 0.043 μm Fine Particles 10: alumina fine particles having an average particle size of 0.070 μm Fine Particles 11: alumina fine particles having an average particle size of 0.094 μm Fine Particles 12: zirconia fine particles having an average particle size of 0.024 μm Fine Particles 13: titania fine particles having an average particle size of 0.014 μm Fine Particles 14: yttria fine particles having an average particle size of 0.008 μm Fine Particles 15: ceria fine particles having an average particle size of 0.029 μm Fine Particles 16: magnesia fine particles having an average particle size of 0.037 μm B. Photosensitive Organic Component (Sub-Component 1)

Monomer I: para-cumylphenol acrylate modified with ethylene oxide (manufactured by TOAGOSEI Co., Ltd.)

Monomer II: bisphenol-A diacrylate modified with ethylene oxide (manufactured by TOAGOSEI Co., Ltd.)

Photopolymerization Initiator:
2-benzyl-dimethylamino-1-(4-morpholinophenyl)-butanone-1

(Sub-Component 2)

Urethane Compound I: a compound, having a molecular weight of 19000 and containing 30% of an ethylene oxide unit, represented by the following formula (1'):

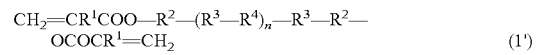

$$CH_2=CR^1COO-R^2-(R^3-R^4)_n-R^3-R^2-OCOCR^1=CH_2 \qquad (1')$$

wherein $R^1$ represents hydrogen, $R^2$ represents an ethylene oxide group, $R^3$ represents an isophorone diisocyanate residue, and $R^4$ represents an ethylene oxide-propylene oxide cooligomer Urethane Compound II: a compound, having a molecular weight of 42000, represented by the above formula (1'), wherein $R^1$ represents hydrogen, $R^2$ represents a propylene oxide group, $R^3$ represents an isophorone diisocyanate residue, and $R^4$ represents a propylene oxide oligomer Urethane Compound III: urethane acrylate, UV6100B, manufactured by Nippon Synthetic Chemical Industry Co., Ltd.

(Sub-Component 3)

Polymer I: a copolymer, prepared using 30% of styrene, 30% methyl methacrylate, and 40% of methacrylic acid and modified by allowing one equivalent of a carboxyl group thereof to react with 0.4 equivalent of glycidyl methacrylate, having a weight-average molecular weight of 43000 and an acid value of 95

Polymer II: a polymer, Cyclomer P (ACA) 250, manufactured by Daicel Chemical Industries Ltd., having a weight-average molecular weight of 10000 and an acid value of 75, the polymer being prepared by allowing 3,4-epoxycyclohexyl methacrylate to react with a copolymer obtained from methacrylic acid and methyl methacrylate C. Preparation of Organic Vehicle A solvent and a polymer were mixed and the mixture was heated to 60° C. while agitated, whereby the polymer was completely dissolved in the solvent. The solution was cooled to room temperature, and an urethan compound, a monomer, and a photopolymerization initiator were dissolved in the solution. The resulting solution was degassed under vacuum conditions and then filtrated with a 250-mesh filter, whereby an organic vehicle was prepared.

D. Preparation of Slurry or Paste

An inorganic component was added to the above organic vehicle, and the they were wet-mixed in a ball mill for 20 hours, whereby slurry or paste was prepared. The prepared slurry or paste had a viscosity of about 25 Pa·s unless otherwise specified.

E. Preparation of Green Sheets

Green sheets were formed in a chamber, shielded from UV rays, by a doctor blade process in such a manner that the distance between a polyester carrier film and a blade is 0.1 to 0.8 mm and the forming rate is 0.2 m/min. The sheet thickness was 100 or 150 µm.

F. Formation of Outer Shape Pattern

Outer Shape

Test Pattern 1

Test Pattern 1 was formed on 100-mm square sheets in such a manner that 5-mm square sections each having seven square openings with the following size were arranged on each sheet at a pitch of 10 mm: a size of 50-µm, 100-µm, 150-µm, 200-µm, 300-µm, 500-µm, or 1-mm square. The openings were present at the center area of each section.

Test Pattern 2

Test Pattern 2 was formed on 100-mm square sheets in such a manner that 5-mm square sections each having seven independent square portions with the following size were arranged on each sheet at a pitch of 10 mm: a size of 50-µm, 100-µm, 150-µm, 200-µm, 300-µm, 500-µm, or 1-mm square.

G. Trimming (Photolithographic Process)

The green sheets were each cut into 100-mm square pieces, and the pieces were heated at 80° C. for one hour, whereby a solvent was evaporated. In order to form a pattern, each piece was exposed using an ultra high-pressure mercury vapor lamp having an output of 15 to 25 mW/cm$^2$ in such a manner that a chromium mask having one of the test patterns described above was directly placed on the upper face of the piece and light was applied thereto. The resulting piece was developed at 25° C. with an aqueous solution containing 0.5% by weight of monoethanolamine, and formed via-holes were cleaned using a spray.

(Punching Process)

Punching dies were prepared based on the above test patterns. The 100-mm square pieces obtained from the green sheets were each punched with the corresponding punching dies.

H. Preparation of Binding Sheets Used for Firing

Paste was prepared by mixing aluminum particles, zirconia particles, or magnesia particles with polyvinyl butyral, dioctyl phthalate, an organic solvent, and the like. The paste was formed into sheets by a doctor blade process.

I. Preparation of Multilayer Substrate

Among the green sheets containing the photosensitive ceramic composite of the present invention, three non-trimmed sheets were stacked and two trimmed sheets were stacked thereon. The resulting sheets were placed between binding sheets for non-shrinkage firing unless otherwise specified. The stacked sheets were heat-pressed at 80° C. with a pressure of 150 kg/cm$^2$. The resulting sheets were fired at 900° C. for 30 minutes in an air atmosphere, whereby multilayer substrates were prepared. The shrinkage caused by firing was measured for the X-Y plane.

In tables below, each sheet having a thickness (thickness pattern) of 100 or 150 µm is represented by symbol A or B, respectively, and the sheets are described from the top. When, for example, the sheets having a thickness of 100, 100, 150, 150, or 150 µm are arranged from the top in that order, the arrangement is described as "AABBB".

J. Evaluation of Prepared Substrate

The sintered substrates were visually evaluated for distortion and warpage. In order to evaluate the reproducibility of an outer shape pattern, the processed substrates were observed with a metallurgical microscope and a scanning electron microscope. Furthermore, in order to evaluate the cross-sectional shape, the substrates were observed with a scanning electron microscope. In order to evaluate the difference in pitch between patterns, a pattern on each substrate was observed with a laser microscope.

Examples 18a to 18d and Comparative Example 3

In order to compare the outer shape formed by the photolithographic process with the outer shape formed by the punching process, samples were tested. Test results are shown in Table 5. When the photolithographic process was used, patterns having a side with a length of at least 100 µm can be precisely formed and substrates having no warpage can be obtained. In contrast, when the punching process was used, patterns, similar to Pattern 1, having portions with a length of less than 250 µm cannot be formed and patterns, similar to Pattern 2, having portions with a length of less than 500 µm cannot be also formed. Thus, fine patterns can be formed on the substrates when the photosensitive ceramic composite and the photolithographic process are used.

When patterns similar to Pattern 2 are formed by the photolithographic process, the carrier film can be used as a transferring sheet; hence, misalignment can be prevented in the stacking step. In contrast, when such patterns are formed by the punching process, the following problems arise: a punching head is shaken and a large amount of manpower is needed to align the independent portions of the sheets in the stacking step and misalignment is one order of magnitude lager than that of patterns formed by the photolithographic process, as shown in Table 5.

TABLE 5

| | Manufacturing Conditions | | | | | | |
|---|---|---|---|---|---|---|---|
| | Composition of Inorganic Components | | Composition of Organic Components | | | | |
| | Inorganic Particles and Content (wt %) | Inorganic Fine Particles and Content (wt %) | Component 1 and Content (wt %) | Component 2 and Content (wt %) | Component 3 and Content (wt %) | Sheet Arrangement | Trimming |
| Example 18a | IS*[1] 1 (70) | Fine Particles 3 (5) | Monomer I (15) and PI*[2] (3) | Urethane Compound I (2) | Polymer I (5) | BBBBB | Photolithographic Process |
| Example 18b | IS*[1] 2 (70) | Fine Particles 7 (5) | Monomer I (15) and PI*[2] (3) | Urethane Compound I (2) | Polymer I (5) | BBBBB | Photolithographic Process |
| Example 18c | IS*[1] 4 (70) | Fine Particles 12 (5) | Monomer I (15) and PI*[2] (3) | Urethane Compound I (2) | Polymer I (5) | BBBBB | Photolithographic Process |
| Example 18d | IS*[1] 6 (70) | Fine Particles 8 (5) | Monomer I (15) and PI*[2] (3) | Urethane Compound I (2) | Polymer I (5) | BBBBB | Photolithographic Process |
| Comparative Example 3 | IS*[1] 6 (70) | Fine Particles 8 (5) | Monomer I (15) and PI*[2] (3) | Urethane Compound I (2) | Polymer I (5) | BBBBB | Punching Process |

| | Inspection Results | | | | |
|---|---|---|---|---|---|
| | Warpage and Distortion | Shrinkage (%) | Reproducible Pattern | | Misalignment (μm) |
| | | | Pattern 1 | Pattern 2 | |
| Example 18a | Not Observed | 0.4 | 100 μm or more | 100 μm or more | 2.1 |
| Example 18b | Not Observed | 0.7 | 100 μm or more | 50 μm or more | 1.9 |
| Example 18c | Not Observed | 0.1 | 50 μm or more | 100 μm or more | 0.9 |
| Example 18d | Not Observed | 0.07 | 50 μm or more | 50 μm or more | 2.2 |
| Comparative Example 3 | Not Observed | 0.07 | 250 μm or more | 500 μm or more | 23 |

*[1]The term "IS" is an acronym for "Inorganic Sub-component".
*[2]The term "PI" is an acronym for "Photopolymerization Initiator".

Examples 19a to 19d

Non-trimmed sheets used in the stacking step were investigated for difference due to the photosensitivity. The same inorganic component as that contained in trimmed sheets was mixed with polyvinyl butyral and dioctyl phthalate, whereby paste was prepared. The paste was formed into sheets having a thickness of 200 μm by a doctor blade process. Those sheets are referred to as non-photosensitive sheets. Test results are shown in Table 6. As shown in Table 6, the non-photosensitive sheets as well as photosensitive sheets can be stacked and also fired.

TABLE 6

| | | Manufacturing Conditions | | | | | | |
|---|---|---|---|---|---|---|---|---|
| | | Composition of Inorganic Components | | Composition of Organic Components | | | | |
| | | Inorganic Particles and Content (wt %) | Inorganic Fine Particles and Content (wt %) | Component 1 and Content (wt %) | Component 2 and Content (wt %) | Component 3 and Content (wt %) | Stacked Sheets | Sheet Arrangement |
| | Example 19a | IS*[1] 1 (70) | Fine Particles 3 (5) | Monomer I (15) and PI*[2] (3) | Urethane Compound I (2) | Polymer I (5) | Photosensitive Sheets | AABBB |
| | Example 19b | IS*[1] 1 (70) | Fine Particles 3 (5) | Monomer I (15) and PI*[2] (3) | Urethane Compound I (2) | Polymer I (5) | Non-photosensitive Sheets | AABBB |
| | Example 19c | IS*[1] 4 (70) | Fine Particles 12 (5) | Monomer I (15) and PI*[2] (3) | Urethane Compound I (2) | Polymer I (5) | Photosensitive Sheets | ABBBB |

TABLE 6-continued

| Example | IS*[1] | Fine Particles | Monomer I (15) and PI*[2] (3) | Urethane Compound I (2) | Polymer I (5) | Non-photosensitive Sheets | AABBB |
|---|---|---|---|---|---|---|---|
| Example 19d | IS*[1] 4 (70) | Fine Particles 12 (5) | Monomer I (15) and PI*[2] (3) | Urethane Compound I (2) | Polymer I (5) | Non-photosensitive Sheets | AABBB |

| | Inspection Results | | | | |
|---|---|---|---|---|---|
| | Warpage and Distortion | Shrinkage (%) | Reproducible Pattern | | Misalignment (μm) |
| | | | Pattern 1 | Pattern 2 | |
| Example 19a | Not Observed | 0.4 | 100 μm or more | 100 μm or more | 2.1 |
| Example 19b | Not Observed | 0.4 | 100 μm or more | 100 μm or more | 2.2 |
| Example 19c | Not Observed | 0.1 | 50 μm or more | 100 μm or more | 0.9 |
| Example 19d | Not Observed | 0.1 | 50 μm or more | 100 μm or more | 1.2 |

*[1] The term "IS" is an acronym for "Inorganic Sub-component".
*[2] The term "PI" is an acronym for "Photopolymerization Initiator".

Examples 20a and 20b

The sheets, prepared in Example 18d and trimmed, having the 500-μm square portions or 1-mm square portions of Pattern 2 were stacked and then fired. Test results are shown in Table 7. When each sheet having the 1-mm square portion is placed on each sheet having the 500-μm square portion, distortion occurs in the boundary between the 1-mm square portion and the 500-μm square portion as shown in Table 7. This is because distortion is prevented from occurring in the sheet having the 1-mm square portion by a binding sheet. Thus, a substrate having satisfactory properties can be prepared by stacking the sheets with the square portion having a size less than or equal to that of the square portion of the sheets placed at a lower position.

TABLE 7

| | Manufacturing Conditions | | | | | |
|---|---|---|---|---|---|---|
| | Composition of Inorganic Components | | Composition of Organic Components | | | |
| | Inorganic Particles and Content (wt %) | Inorganic Fine Particles and Content (wt %) | Component 1 and Content (wt %) | Component 2 and Content (wt %) | Component 3 and Content (wt %) | Sheet Arrangement |
| Example 20a | IS*[1] 6 (70) | Fine Particles 8 (5) | Monomer I (15) and PI*[2] (3) | Urethane Compound I (2) | Polymer I (5) | AAAAA |
| Example 20b | IS*[1] 6 (70) | Fine Particles 8 (5) | Monomer I (15) and PI*[2] (3) | Urethane Compound I (2) | Polymer I (5) | AAAAA |

| | Manufacturing Conditions Stacking Order | Inspection Results Warpage and Distortion |
|---|---|---|
| Example 20a | Binding Sheet/Sheet Having 500-μm Square Portion/Sheet Having 1-mm Square Portion/Non-trimmed Sheet/Binding Sheet | Not Observed |
| Example 20b | Binding Sheet/Sheet Having 1-mm Square Portion/Sheet Having 500-μm Square Portion/Nontrimmed Sheet/Binding Sheet | Distortion and cracks were observed at the boundary between the 1-mm square portion and the 500-μm square portion. |

*[1] The term "IS" is an acronym for "Inorganic Sub-component".
*[2] The term "PI" is an acronym for "Photopolymerization Initiator".

Examples 21a to 21l

In order to evaluate the effect of the binding sheets, a change in the shape of trimmed ceramic substrates was investigated. Test items and results are shown in Table 8, which shows that distortion and warpage can be prevented from occurring, the preciseness of the outer pattern can be enhanced, and misalignment can be prevented from occurring by performing non-shrinkage firing using the binding sheets.

TABLE 8

| | Manufacturing Conditions | | | | | | |
|---|---|---|---|---|---|---|---|
| | Composition of Inorganic Components | | Composition of Organic Components | | | | |
| | Inorganic Particles and Content (wt %) | Inorganic Fine Particles and Content (wt %) | Component 1 and Content (wt %) | Component 2 and Content (wt %) | Component 3 and Content (wt %) | Sheet Arrangement | Binding Sheet |
| Example 21a | IS*1 1 (70) | Fine Particles 1 (5) | Monomer I (15) and PI*2 (3) | Urethane Compound I (2) | Polymer II (5) | AABBB | Used |
| Example 21b | IS*1 2 (70) | Fine Particles 3 (5) | Monomer II (15) and PI*2 (3) | Urethane Compound II (2) | Polymer I (5) | ABBBB | Used |
| Example 21c | IS*1 3 (70) | Fine Particles 5 (5) | Monomer I (15) and PI*2 (3) | Urethane Compound III (2) | Polymer II (5) | AABBB | Used |
| Example 21d | IS*1 4 (70) | Fine Particles 7 (5) | Monomer II (15) and PI*2 (3) | Urethane Compound I (2) | Polymer I (5) | AAAAA | Used |
| Example 21e | IS*1 5 (70) | Fine Particles 7 (5) | Monomer I (15) and PI*2 (3) | Urethane Compound II (2) | Polymer II (5) | AABBB | Used |
| Example 21f | IS*1 6 (70) | Fine Particles 8 (5) | Monomer II (15) and PI*2 (3) | Urethane Compound III (2) | Polymer I (5) | AABBB | Used |
| Example 21g | IS*1 1 (70) | Fine Particles 1 (5) | Monomer I (15) and PI*2 (3) | Urethane Compound I (2) | Polymer II (5) | AABBB | Not Used |
| Example 21h | IS*1 2 (70) | Fine Particles 3 (5) | Monomer II (15) and PI*2 (3) | Urethane Compound II (2) | Polymer I (5) | ABBBB | Not Used |
| Example 21i | IS*1 3 (70) | Fine Particles 5 (5) | Monomer I (15) and PI*2 (3) | Urethane Compound III (2) | Polymer II (5) | AABBB | Not Used |
| Example 21j | IS*1 4 (70) | Fine Particles 7 (5) | Monomer II (15) and PI*2 (3) | Urethane Compound I (2) | Polymer I (5) | AAAAA | Not Used |
| Example 21k | IS*1 5 (70) | Fine Particles 7 (5) | Monomer I (15) and PI*2 (3) | Urethane Compound II (2) | Polymer II (5) | AABBB | Not Used |
| Example 21l | IS*1 6 (70) | Fine Particles 8 (5) | Monomer II (15) and PI*2 (3) | Urethane Compound III (2) | Polymer I (5) | AABBB | Not Used |

| | Inspection Results | | | | |
|---|---|---|---|---|---|
| | Warpage and Distortion | Shrinkage (%) | Reproducible Pattern | | Misalignment (μm) |
| | | | Pattern 1 | Pattern 2 | |
| Example 21a | Not Observed | 0.2 | 100 μm or more | 100 μm or more | 2.1 |
| Example 21b | Not Observed | 0.03 | 100 μm or more | 50 μm or more | 1.9 |
| Example 21c | Not Observed | 1.03 | 50 μm or more | 100 μm or more | 0.9 |
| Example 21d | Not Observed | 0.07 | 150 μm or more | 50 μm or more | 2.2 |
| Example 21e | Not Observed | 0.1 | 50 μm or more | 50 μm or more | 2.8 |
| Example 21f | Not Observed | 0.07 | 50 μm or more | 50 μm or more | 1.6 |
| Example 21g | Not Observed | 17.2 | 150 μm or more | 250 μm or more | 4.6 |
| Example 21h | Not Observed | 16.9 | 100 μm or more | 100 μm or more | 5.3 |
| Example 21i | Partly Observed | 15 | 200 μm or more | 150 μm or more | 3.6 |
| Example 21j | Not Observed | 19.3 | 150 μm or more | 100 μm or more | 4.6 |
| Example 21k | Not Observed | 16.8 | 100 μm or more | 100 μm or more | 5.5 |
| Example 21l | Not Observed | 14.3 | 100 μm or more | 100 μm or more | 7.6 |

*1 The term "IS" is an acronym for "Inorganic Sub-component".
*2 The term "PI" is an acronym for "Photopolymerization Initiator".

Examples 22a to 22g

Evaluation was made for trimmed ceramic substrates prepared by varying the content of inorganic particles in the photosensitive ceramic composite. Test items and results are shown in Table 9, which shows that serious distortion and warpage occurring in the firing step cause a deterioration in the pattern shape and the preciseness of alignment when the content of the inorganic particles is less than about 70% by weight. In contrast, when the content of the inorganic particles is more than about 93% by weight, a large number of cracks are formed in the substrates in the stacking step and/or the firing step, that is, uniform substrates cannot be prepared, because the content of an organic component is too small to maintain the sheets flexible. Thus, in order to precisely trim the substrates prepared using the photosensitive ceramic composite, the content of the inorganic particles is preferably within a range of 72% to 95% on a weight basis.

Examples 23a to 23n

Investigation was made for the correlation between trimming accuracy and the content of fine particles in inorganic particles contained in the photosensitive ceramic composite. In order to investigate the effect of a change in the average particle size of the fine particles, part of the alumina particles, of which the content in Inorganic Sub-component 6 is 52% by weight, were replaced with alumina fine particles.

Test items and results are shown in Table 10, which shows that distortion occurs when the content of the alumina fine particles in the inorganic particles is less than 5% by weight. When the content of the alumina fine particles is within a range of 5% to 25% on a weight basis, distortion hardly occurs and the sheets can be precisely trimmed by the photolithographic process. When the content is more than 25% by weight, the substrates obtained by firing have cavities therein because aggregation occurs in the photosensitive ceramic composite. Therefore, uniformity of the sub-

TABLE 9

| | Manufacturing Conditions | | | | | | |
|---|---|---|---|---|---|---|---|
| | Composition of Inorganic Components | | Composition of Organic Components | | | | |
| | Inorganic Particles and Content (wt %) | Inorganic Fine Particles and Content (wt %) | Component 1 and Content (wt %) | Component 2 and Content (wt %) | Component 3 and Content (wt %) | Content of Inorganic Components (wt %) | Arrangement |
| Example 22a | IS*[1] 6 (92) | Fine Particles 8 (8) | Monomer I (60) and PI*[2] (12) | Urethane Compound I (8) | Polymer II (20) | 62 | AABBB |
| Example 22b | IS*[1] 6 (92) | Fine Particles 8 (8) | Monomer I (60) and PI*[2] (12) | Urethane Compound I (8) | Polymer II (20) | 70 | AABBB |
| Example 22c | IS*[1] 6 (92) | Fine Particles 8 (8) | Monomer I (60) and PI*[2] (12) | Urethane Compound I (8) | Polymer II (20) | 73 | AABBB |
| Example 22d | IS*[1] 6 (92) | Fine Particles 8 (8) | Monomer I (60) and PI*[2] (12) | Urethane Compound I (8) | Polymer II (20) | 78 | AABBB |
| Example 22e | IS*[1] 6 (92) | Fine Particles 8 (8) | Monomer I (60) and PI*[2] (12) | Urethane Compound I (8) | Polymer II (20) | 86 | AABBB |
| Example 22f | IS*[1] 6 (92) | Fine Particles 8 (8) | Monomer I (60) and PI*[2] (12) | Urethane Compound I (8) | Polymer II (20) | 93 | ABBBB |
| Example 22g | IS*[1] 6 (92) | Fine Particles 8 (8) | Monomer I (60) and PI*[2] (12) | Urethane Compound I (8) | Polymer II (20) | 97 | AABBB |

| | Inspection Results | | | | |
|---|---|---|---|---|---|
| | Warpage and | | Reproducible Pattern | | |
| | Distortion | Shrinkage (%) | Pattern 1 | Pattern 2 | Misalignment (μm) |
| Example 22a | Seriously Warped | Not Measurable | 500 μm or more | 500 μm or more | Not Measurable |
| Example 22b | Warped | 3.5 | 100 μm or more | 50 μm or more | 4.6 |
| Example 22c | Slightly Distorted | 2.2 | 50 μm or more | 100 μm or more | 2.3 |
| Example 22d | Not Observed | 0.07 | 50 μm or more | 50 μm or more | 0.6 |
| Example 22e | Not Observed | 0.04 | 50 μm or more | 50 μm or more | 1.1 |
| Example 22f | Partly Warped | 0.03 | 50 μm or more | 50 μm or more | 1.6 |
| Example 22g | Cracked | Not Measurable | 300 μm or more | None | Not Measurable |

*[1]The term "IS" is an acronym for "Inorganic Sub-component".
*[2]The term "PI" is an acronym for "Photopolymerization Initiator".

strate structure got worse. It caused the deterioration of the accuracy in trimming and alignment. Thus, when the content of the alumina fine particles in the inorganic particles is within a range of 5% to 25% on a weight basis, the ceramic substrates, precisely trimmed, having a satisfactory density can be obtained.

TABLE 10

| | Manufacturing Conditions | | | | | | | |
|---|---|---|---|---|---|---|---|---|
| | Inorganic Components | | | Composition of Organic Components | | | | |
| | Glass Content*1 (wt %) | Alumina Content*2 (wt %) | IFP*3 and Content (wt %) | Component 1 and Content (wt %) | Component 2 and Content (wt %) | Component 3 and Content (wt %) | Content of Inorganic Components (wt %) | Sheet Arrangement |
| Example 23a | 48 | 52 | Not Used | Monomer I (60) and PI*4 (12) | Urethane Compound I (8) | Polymer II (20) | 80 | AABBB |
| Example 23b | 48 | 50 | IFP*3 7 (2) | Monomer I (60) and PI*4 (12) | Urethane Compound I (8) | Polymer II (20) | 80 | AABBB |
| Example 23c | 48 | 45 | IFP*3 7 (7) | Monomer I (60) and PI*4 (12) | Urethane Compound I (8) | Polymer II (20) | 80 | AABBB |
| Example 23d | 48 | 37 | IFP*3 7 (15) | Monomer I (60) and PI*4 (12) | Urethane Compound I (8) | Polymer II (20) | 80 | AABBB |
| Example 23e | 48 | 30 | IFP*3 7 (22) | Monomer I (60) and PI*4 (12) | Urethane Compound I (8) | Polymer II (20) | 80 | AABBB |
| Example 23f | 48 | 25 | IFP*3 7 (27) | Monomer I (60) and PI*4 (12) | Urethane Compound I (8) | Polymer II (20) | 80 | AABBB |
| Example 23g | 48 | 21 | IFP*3 7 (31) | Monomer I (60) and PI*4 (12) | Urethane Compound I (8) | Polymer II (20) | 80 | AABBB |
| Example 23h | 48 | 52 | Not Used | Monomer I (60) and PI*4 (12) | Urethane Compound I (8) | Polymer II (20) | 80 | AABBB |
| Example 23i | 48 | 50 | IFP*3 8 (2) | Monomer I (60) and PI*4 (12) | Urethane Compound I (8) | Polymer II (20) | 80 | ABBBB |
| Example 23j | 48 | 45 | IFP*3 8 (7) | Monomer I (60) and PI*4 (12) | Urethane Compound I (8) | Polymer II (20) | 80 | AABBB |
| Example 23k | 48 | 37 | IFP*3 8 (15) | Monomer I (60) and PI*4 (12) | Urethane Compound I (8) | Polymer II (20) | 80 | AABBB |
| Example 23l | 48 | 30 | IFP*3 8 (22) | Monomer I (60) and PI*4 (12) | Urethane Compound I (8) | Polymer II (20) | 80 | AABBB |
| Example 23m | 48 | 25 | IFP*3 8 (27) | Monomer I (60) and PI*4 (12) | Urethane Compound I (8) | Polymer II (20) | 80 | AABBB |
| Example 23n | 48 | 21 | IFP*3 8 (31) | Monomer I (60) and PI*4 (12) | Urethane Compound I (8) | Polymer II (20) | 80 | AABBB |

| | Inspection Results | | | | |
|---|---|---|---|---|---|
| | | | Reproducible Pattern | | |
| | Warpage and Distortion | Shrinkage (%) | Pattern 1 | Pattern 2 | Misalignment (μm) |
| Example 23a | Partly Distorted | 0.04 | 100 μm or more | 100 μm or more | 1.2 |
| Example 23b | Partly Distorted | 3.5 | 100 μm or more | 100 μm or more | 1.1 |
| Example 23c | Not Observed | 1.4 | 50 μm or more | 100 μm or more | 0.9 |
| Example 23d | Not Observed | 0.07 | 50 μm or more | 50 μm or more | 0.24 |
| Example 23e | Not Observed | 0.04 | 50 μm or more | 50 μm or more | 0.6 |
| Example 23f | Not Observed | 1.5 | 100 μm or more | 200 μm or more | 1.1 |
| Example 23g | Many Cavities | 2.2 | 300 μm or more | 500 μm or more | 1.6 |
| Example 23h | Partly Distorted | 0.9 | 100 μm or more | 100 μm or more | 1.2 |
| Example 23i | Not Observed | 0.43 | 100 μm or more | 100 μm or more | 0.8 |
| Example 23j | Not Observed | 0.2 | 50 μm or more | 100 μm or more | 0.7 |
| Example 23k | Not Observed | 0.04 | 50 μm or more | 50 μm or more | 0.1 |

TABLE 10-continued

| | | | | | |
|---|---|---|---|---|---|
| Example 23l | Not Observed | 0.03 | 50 μm or more | 50 μm or more | 0.4 |
| Example 23m | Not Observed | 0.8 | 50 μm or more | 50 μm or more | 1.6 |
| Example 23n | Not Observed | 1.6 | 100 μm or more | 100 μm or more | 2.7 |

*[1]The term "Glass Content" means the content of a glass component in Inorganic Sub-component 6.
*[2]The term "Alumina Content" means the content of alumina particles in Inorganic Sub-component 6.
*[3]The term "IFP" is an acronym for "inorganic fine particles".
*[4]The term "PI" is an acronym for "Photopolymerization Initiator".

Examples 24a to 24i

Investigation was made for the change in the viscosity of a solution used in the step of forming the photosensitive ceramic composite into sheets. Test items and results are shown in Table 11. In every sample, the results show that the square portions having area of 50 μm or more in Pattern 1 or 2 can be formed by trimming with high reproducibility. Table 11 shows that serious warpage and the change in sheet thickness cause a deterioration in the preciseness of alignment, local cracks, and strain when the viscosity of slurry or paste used in the sheet-forming step is less than about 5 Pa·s or more than 100 Pa·s. When the viscosity is within a range of about 5 to 100 Pa·s, distortion hardly occurs and the ceramic substrates trimmed precisely can therefore be obtained. A cross section of a sample prepared in Example 24a was observed with an electron probe X-ray microanalyzer. The analysis showed that the alumina particles are locally aggregated and concentrated at boundaries between the sheets and the carrier film.

TABLE 11

| | Manufacturing Conditions | | | | | | | |
|---|---|---|---|---|---|---|---|---|
| | Inorganic Components | | | Composition of Organic Components | | | | |
| | Glass Content*[1] (wt %) | Alumina Content*[2] (wt %) | IFP*[3] and Content (wt %) | Component 1 and Content (wt %) | Component 2 and Content (wt %) | Component 3 and Content (wt %) | Content of Inorganic Components (wt %) | Viscosity of Paste (Pa.s) |
| Example 24a | 48 | 37 | IFP*[3] 8 (15) | Monomer I (60) and PI*[4] (12) | Urethane Compound I (8) | Polymer II (20) | 80 | 1.5 |
| Example 24b | 48 | 37 | IFP*[3] 8 (15) | Monomer I (60) and PI*[4] (12) | Urethane Compound I (8) | Polymer II (20) | 80 | 3.9 |
| Example 24c | 48 | 37 | IFP*[3] 8 (15) | Monomer I (60) and PI*[4] (12) | Urethane Compound I (8) | Polymer II (20) | 80 | 5.4 |
| Example 24d | 48 | 37 | IFP*[3] 8 (15) | Monomer I (60) and PI*[4] (12) | Urethane Compound I (8) | Polymer II (20) | 80 | 25 |
| Example 24e | 48 | 37 | IFP*[3] 8 (15) | Monomer I (60) and PI*[4] (12) | Urethane Compound I (8) | Polymer II (20) | 80 | 55 |
| Example 24f | 48 | 37 | IFP*[3] 8 (15) | Monomer I (60) and PI*[4] (12) | Urethane Compound I (8) | Polymer II (20) | 80 | 79 |
| Example 24g | 48 | 37 | IFP*[3] 8 (15) | Monomer I (60) and PI*[4] (12) | Urethane Compound I (8) | Polymer II (20) | 80 | 106 |
| Example 24h | 48 | 37 | IFP*[3] 8 (15) | Monomer I (60) and PI*[4] (12) | Urethane Compound I (8) | Polymer II (20) | 80 | 205 |
| Example 24i | 48 | 37 | IFP*[3] 8 (15) | Monomer I (60) and PI*[4] (12) | Urethane Compound I (8) | Polymer II (20) | 80 | 320 |

| | Manufacturing Conditions | Inspection Results | | |
|---|---|---|---|---|
| | Sheet Arrangement | Warpage and Distortion | Shrinkage (%) | Misalignment (μm) |
| Example 23a | AABBB | Seriously Warped | Not measurable | Not measurable |
| Example 23b | AABBB | Partly Distorted | 0.15 | 4.6 |
| Example 23c | AABBB | Partly Distorted | 0.1 | 1.3 |
| Example 23d | AABBB | Not Observed | 0.04 | 0.12 |
| Example 23e | AABBB | Not Observed | 0.04 | 0.09 |
| Example 23f | AABBB | Not Observed | 0.04 | 0.1 |
| Example 23g | AABBB | Not Observed | 0.04 | 0.6 |

TABLE 11-continued

| | | | | |
|---|---|---|---|---|
| Example 23h | AABBB | Uneven Thickness | 0.12 | 0.9 |
| Example 23i | AABBB | Uneven Thickness | 0.32 | 1.3 |

*[1]The term "Glass Content" means the content of a glass component in Inorganic Sub-component 6.
*[2]The term "Alumina Content" means the content of alumina particles in Inorganic Sub-component 6.
*[3]The term "IFP" is an acronym for "inorganic fine particles".
*[4]The term "PI" is an acronym for "Photopolymerization Initiator".

Examples 25a to 25e

Investigation was made for the correlation between the trimming accuracy and the particle size of the inorganic particles contained in the photosensitive ceramic composite. Test items and results are shown in Table 12. The accuracy of photolithographic trimming is low when the particle size of the fine particles is more than about 50 nm, as shown in Table 12. In contrast, when the particle size is about 10 nm, cavities are locally present and the aggregation is suppressed due to an increase in the surface area of the inorganic particles. Thus, the particle size is preferably about 5 nm or more.

Examples 26a to 26g

Investigation was made for the composition of the inorganic fine particles contained in the photosensitive ceramic composite. Test items and results are shown in Table 13. In all the types of the fine particles that are different in composition, trimming properties in the same level can be obtained as shown in Table 13. In the X-ray analysis of the sintered samples, positions of diffraction peaks assigned to individual crystal structures and the peak width at half height show that there is no change in crystal structure in the samples.

TABLE 12

| | Manufacturing Conditions | | | | | | | |
|---|---|---|---|---|---|---|---|---|
| | Inorganic Components | | | Composition of Organic Components | | | | |
| | Glass Content*[1] (wt %) | Alumina Content*[2] (wt %) | IFP*[3] and Content (wt %) | Component 1 and Content (wt %) | Component 2 and Content (wt %) | Component 3 and Content (wt %) | Content of Inorganic Components (wt %) | Sheet Arrangement |
| Example 25a | 48 | 37 | IFP*[3] 7 (15) | Monomer I (60) and PI*[4] (12) | Urethane Compound I (8) | Polymer II (20) | 80 | ABBBB |
| Example 25b | 48 | 37 | IFP*[3] 8 (15) | Monomer I (60) and PI*[4] (12) | Urethane Compound I (8) | Polymer II (20) | 80 | ABBBB |
| Example 25c | 48 | 37 | IFP*[3] 9 (15) | Monomer I (60) and PI*[4] (12) | Urethane Compound I (8) | Polymer II (20) | 80 | ABBBB |
| Example 25d | 48 | 37 | IFP*[3] 10 (15) | Monomer I (60) and PI*[4] (12) | Urethane Compound I (8) | Polymer II (20) | 80 | ABBBB |
| Example 25e | 48 | 37 | IFP*[3] 11 (15) | Monomer I (60) and PI*[4] (12) | Urethane Compound I (8) | Polymer II (20) | 80 | ABBBB |

| | Inspection Results | | | | |
|---|---|---|---|---|---|
| | | | Reproducible Pattern | | |
| | Warpage and Distortion | Shrinkage (%) | Pattern 1 | Pattern 2 | Misalignment (μm) |
| Example 25a | Small Number of Cavities | 0.08 | 50 μm or more | 50 μm or more | 0.12 |
| Example 25b | Not Observed | 0.04 | 50 μm or more | 50 μm or more | 0.12 |
| Example 25c | Not Observed | 0.04 | 50 μm or more | 50 μm or more | 0.12 |
| Example 25d | Not Observed | 0.04 | 50 μm or more | 100 μm or more | 0.12 |
| Example 25e | Not Observed | 0.91 | 100 μm or more | 100 μm or more | 0.12 |

*[1]The term "Glass Content" means the content of a glass component in Inorganic Sub-component 6.
*[2]The term "Alumina Content" means the content of alumina particles in Inorganic Sub-component 6.
*[3]The term "IFP" is an acronym for "inorganic fine particles".
*[4]The term "PI" is an acronym for "Photopolymerization Initiator".

TABLE 13

| | Manufacturing Conditions | | | | | |
|---|---|---|---|---|---|---|
| | Composition of Inorganic Components | | Composition of Organic Components | | | |
| | Inorganic Particles and Content (wt %) | Inorganic Fine Particles and Content (wt %) | Component 1 and Content (wt %) | Component 2 and Content (wt %) | Component 3 and Content (wt %) | Sheet Arrangement |
| Example 26a | IS*[1] 1 (70) | Fine Particles 3 (5) | Monomer I (15) and PI*[2] (3) | Urethane Compound I (2) | Polymer I (5) | BABBB |
| Example 26b | IS*[1] 1 (70) | Fine Particles 9 (5) | Monomer I (15) and PI*[2] (3) | Urethane Compound I (2) | Polymer I (5) | ABBBB |
| Example 26c | IS*[1] 1 (70) | Fine Particles 12 (5) | Monomer I (15) and PI*[2] (3) | Urethane Compound I (2) | Polymer I (5) | ABBBB |
| Example 26d | IS*[1] 1 (70) | Fine Particles 13 (5) | Monomer I (15) and PI*[2] (3) | Urethane Compound I (2) | Polymer I (5) | AABBB |
| Example 26e | IS*[1] 1 (70) | Fine Particles 14 (5) | Monomer I (15) and PI*[2] (3) | Urethane Compound I (2) | Polymer I (5) | BBBBB |
| Example 26f | IS*[1] 1 (70) | Fine Particles 15 (5) | Monomer I (15) and PI*[2] (3) | Urethane Compound I (2) | Polymer I (5) | ABBBB |
| Example 26g | IS*[1] 1 (70) | Fine Particles 16 (5) | Monomer I (15) and PI*[2] (3) | Urethane Compound I (2) | Polymer I (5) | AABBB |

| | Inspection Results | | | | |
|---|---|---|---|---|---|
| | Warpage and Distortion | Shrinkage (%) | Reproducible Pattern | | Misalignment (μm) |
| | | | Pattern 1 | Pattern 2 | |
| Example 26a | Not Observed | 0.4 | 100 μm or more | 100 μm or more | 2.1 |
| Example 26b | Not Observed | 0.4 | 100 μm or more | 100 μm or more | 1.6 |
| Example 26c | Not Observed | 0.41 | 100 μm or more | 100 μm or more | 1.6 |
| Example 26d | Not Observed | 0.35 | 100 μm or more | 100 μm or more | 2.1 |
| Example 26e | Not Observed | 0.32 | 100 μm or more | 100 μm or more | 2.6 |
| Example 26f | Not Observed | 0.29 | 100 μm or more | 100 μm or more | 1 |
| Example 26g | Not Observed | 0.4 | 100 μm or more | 100 μm or more | 2.1 |

*[1] The term "IS" is an acronym for "Inorganic Sub-component".
*[2] The term "PI" is an acronym for "Photopolymerization Initiator".

Example 27

A dielectric patch antenna was prepared using the sample obtained in Example 18d. The reflectivity thereof was measured using a network analyzer. The same preparation and measurement as the above were made for the sample, prepared in Comparative Example 1, punched with the die. As a result, both samples had a resonant frequency of 2.45 GHz; however, the sample prepared by the photolithographic process had a band width of ±17 MHz and the sample prepared by the punching process had a band width of ±55 MHz.

(4) Preparation of Photosensitive Ceramic Composite Containing Organic Component, Containing Low Refractive Index Sub-component, Having Optimized Flexibility, Compatibility, and Developability and Preparation of Multilayer Substrate Containing the Composite Example 28

A photosensitive ceramic composite was prepared using the inorganic-particle source material, used in Example 1 of Item (1), containing particles having the $SiO_2$ layers with a thickness of 70 nm and the photosensitive organic component, used in Example 5 of Item (2), containing Polymer I (15%), Urethane Compound I (2%), Monomer I (5%), and the photopolymerization initiator. A sample for evaluating the light transmittance was prepared in the same manner as that described in Item (1). The measurement showed that the sample has a total beam transmittance of 65% and a rectilinear beam transmittance of 7.8%. The composite was formed into green sheets having a thickness of 100 or 150 μm. The formation of via-holes was attempted, and 40-μm via-holes were obtained. In a step of developing the sheets, a solution having the following composition was used: the same composition as that of Developing Solution I used in Example 5 of Item (2). The photosensitive organic component had a haze of 0.1. The change in line width was 1.2. The obtained green sheets were cured and then placed between alumina binding sheets. The resulting green sheets were fired at 900° C. for 30 minutes, whereby a multilayer substrate. The multilayer substrate had no cracks but had a bending structure of 270 MPa and a dielectric constant of 7.8 (1 MHz). The cured green sheets had a tensile strength of 0.6 N/mm² and an elongation of 20%.

The green sheets were trimmed in the same manner as that described in Example 18 of Item (3), whereby a white multilayer substrate was prepared. In the trimming step, for Patterns 1 and 2 described in Example 18 of Item (3), the square portions having a size of at least 100 μm square or more were formed. The substrate had no warpage.

A dielectric patch antenna was prepared using this sample. The reflectivity thereof was measured using a network analyzer. The sample had a resonant frequency of 2.45 GHz and a band width of ±12 MHz.

INDUSTRIAL APPLICABILITY

According to the present invention, ceramic-substrate source materials in which fine structures having a high aspect ratio can be formed can be prepared using a photosensitive organic component containing inorganic particles, as described above. Since distortion and the like do not occur in sheets containing the composite in preparing steps, fine processing properties and high reproducibility can be achieved.

A ceramic multilayer substrate having an arbitrary outer shape can be prepared with high reproducibility using the composite of the present invention, the shape being formed by trimming sheets by a photolithographic process.

The invention claimed is:

1. A photosensitive ceramic composite containing inorganic particles and a photosensitive organic component, wherein the inorganic particles have at least surface sections containing an inorganic material having a refractive index less than that of inner sections of the inorganic particles.

2. The photosensitive ceramic composite according to claim 1, wherein the formula $5 \leq t \leq 200$ (nm) is satisfied, where t represents the thickness of the surface sections containing the low-refractive index material.

3. The photosensitive ceramic composite according to claim 1, wherein the following formulas are satisfied:

$$0.05 \leq R1-R2$$

$$-0.15 \leq R2-R3$$

where R1 represents the refractive index of the inner sections of the inorganic particle, R2 represents the refractive index of the low-refractive index material, and R3 represents the refractive index of the photosensitive organic component.

4. The photosensitive ceramic composite according to claim 1, wherein the formula $1.1 \leq ST1/ST2$ is satisfied, where ST1 represents the rectilinear beam transmittance of the photosensitive ceramic composite and ST2 represents the rectilinear beam transmittance of the photosensitive ceramic composite that does not have the sections containing the low-refractive index material.

5. The photosensitive ceramic composite according to claim 1, wherein the low-refractive index material contains at least one selected from the group consisting of ZnS, CeF₂, MgF₂, and SiO₂.

6. The photosensitive ceramic composite according to claim 1, wherein the shrinkage in the X-Y plane is 1% or less before and after a firing step and the formula $N1-N2 \leq 0.15$ is satisfied, where N1 represents the refractive index of a component having a maximal refractive index and N2 represents the refractive index of a component having a minimal refractive index.

7. The photosensitive ceramic composite according to claim 1, wherein the inorganic particles contain at least one selected from the group consisting of alumina, zirconia, magnesia, beryllia, mullite, spinel, forsterite, anorthite, celsian, and aluminum nitride.

8. The photosensitive ceramic composite according to claim 1, wherein the inorganic particles contain a compound represented by the formula $R_xO-Al_2O_3-SiO_2$, where x=2 when R represents an alkali metal and x=1 when R represents an alkaline-earth metal.

9. The photosensitive ceramic composite according to claim 1, wherein the inorganic particles are a mixture containing 50% to 90% of glass particles and 10% to 50% of quartz particles, amorphous silica particles or a mixture of quartz particles and amorphous silica particles on a weight basis.

10. The photosensitive ceramic composite according to claim 1, wherein the inorganic particles are a mixture containing 30% to 60% of borosilicate glass particles, 20% to 60% of quartz particles, amorphous silica particles or a mixture of quartz particles and amorphous silica particles, and 20% to 60% of ceramic particles containing at least one selected from the group consisting of spinel, forsterite, anorthite, and celsian on a weight basis.

11. The photosensitive ceramic composite according to claim 1, wherein the inorganic particles are a mixture containing 30% to 60% of glass particles and 40% to 70% of ceramic particles containing at least one selected from the group consisting of alumina, zirconia, magnesia, beryllia, mullite, spinel, forsterite, anorthite, celsian, and aluminum nitride, and the glass particles contain 85% or more of oxides and have a SiO₂ content of 30% to 70%, an Al₂O₃ content of 5% to 40%, a CaO content of 3% to 25%, and a B₂O₃ content of 3% to 50% on a weight basis.

12. The photosensitive ceramic composite according to claim 1, wherein the photosensitive organic component contains an acrylic copolymer having side chains with a carboxyl group, a photoreactive compound, and a photopolymerization initiator.

13. The photosensitive ceramic composite according to claim 1, wherein the content of the photosensitive organic component ranges from 10% to 40% on a weight basis.

14. The photosensitive ceramic composite according to claim 1, wherein the photosensitive organic component comprises a urethane compound having an ethylenic unsaturated group and a (meth)acrylate compound represented by the following formula (1):

$$CH_2=CR^1COO-(R^2)_n-R^3-R^0 \quad (1)$$

wherein $R^0$ represents a $CH_2=CR^1COO-(R^2)_n$-group, a hydrogen atom, or a halogen atom; $R^1$ represents a hydrogen atom or a methyl group; $R^2$ represents an alkylene oxide group or an alkylene oxide oligomer group; $R^3$ represents a cyclic or acyclic group selected from the group consisting of an alkylene group, an aryl group, an aryl ether group, an arylene group, an arylene ether group, an aralkyl group, and an aralkylene group having 1 to 15 carbon atoms or represents such a cyclic or acyclic group having a substituent such as an alkyl group having 1 to 9 carbon atoms, a halogen atom, a hydroxy group, or an aryl group; and n represents an integer of 1 to 5.

15. The photosensitive ceramic composite according to claim 14, wherein the group represented by $R^3$ in formula (1) has at least one aromatic ring.

16. The photosensitive ceramic composite according to claim 14, wherein the group represented by $R^2$ in formula (1) has at least one ethylene oxide group.

17. The photosensitive ceramic composite according to claim 14, wherein the (meth)acrylate compound is para-cumylphenol (meth)acrylate modified with ethylene oxide.

18. The photosensitive ceramic composite according to claim 14, wherein the urethane compound is a urethane compound represented by the following formula (2):

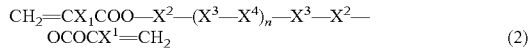
$$CH_2=CX_1COO-X^2-(X^3-X^4)_n-X^3-X^2-OCOCX^1=CH_2 \qquad (2)$$

wherein $X^1$ represents hydrogen, a hydroxy group, or a methyl group; $X^2$ and $X^4$ each represent an alkylene oxide group or an alkylene oxide oligomer group; at least one of the group represented by $X^2$ and the group represented by $X^4$ has an ethylene oxide group; $X^3$ represents an aliphatic diisocyanate residue or a cycloaliphatic diisocyanate residue having a urethane bond; and n represents an integer of 1 to 10.

19. A method for manufacturing a multilayer substrate using the photosensitive ceramic composite containing the inorganic particles and photosensitive organic component according to claim 1, comprising:
   (1) a step of forming the photosensitive ceramic composite into photosensitive green sheets;
   (2) a step of trimming the resulting photosensitive green sheets by a photolithographic process;
   (3) a step of stacking the resulting photosensitive green sheets; and
   (4) a step of firing the resulting photosensitive green sheets.

20. A method for manufacturing a multilayer substrate using the photosensitive ceramic composite containing the inorganic particles and photosensitive organic component according to claim 1, comprising:
   (1) a step of forming the photosensitive ceramic composite into photosensitive green sheets, the sheets being placed on a carrier film;
   (2) a step of trimming the photosensitive green sheets placed on the carrier film such that the photosensitive green sheets have isolated portions;
   (3) a step of separating the photosensitive green sheets having the isolated portions from the film to stack the resulting sheets; and
   (4) a step of firing the stacked photosensitive green sheets.

21. A multilayer substrate manufactured by the method according to claim 20.

* * * * *